(12) United States Patent
Kim et al.

(10) Patent No.: US 12,275,228 B2
(45) Date of Patent: Apr. 15, 2025

(54) RELEASE FILM

(71) Applicant: Samsung Display Co., Ltd., Yongin-Si (KR)

(72) Inventors: Hun-Tae Kim, Seoul (KR);
Kyunghoon Kim, Asan-si (KR);
Gyumdong Bae, Cheonan-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 278 days.

(21) Appl. No.: 18/096,677

(22) Filed: Jan. 13, 2023

(65) Prior Publication Data

US 2023/0226804 A1 Jul. 20, 2023

(30) Foreign Application Priority Data

Jan. 17, 2022 (KR) ........................ 10-2022-0006528

(51) Int. Cl.
| | | |
|---|---|---|
| H05K 1/18 | (2006.01) | |
| B32B 7/12 | (2006.01) | |
| B32B 15/06 | (2006.01) | |
| B32B 15/095 | (2006.01) | |
| B32B 15/18 | (2006.01) | |
| B32B 27/40 | (2006.01) | |
| H05K 3/30 | (2006.01) | |

(52) U.S. Cl.
CPC .............. *B32B 7/12* (2013.01); *B32B 15/06* (2013.01); *B32B 15/095* (2013.01); *B32B 15/18* (2013.01); *B32B 27/40* (2013.01); *B32B 2274/00* (2013.01); *B32B 2307/202* (2013.01); *B32B 2307/748* (2013.01); *B32B 2457/20* (2013.01); *H05K 1/18* (2013.01); *H05K 3/30* (2013.01); *H05K 2201/09027* (2013.01); *H05K 2201/10128* (2013.01); *H05K 2203/304* (2013.01)

(58) Field of Classification Search
CPC .................. H05K 1/18; H05K 30/30; H05K 2201/09027; H05K 2201/10128; H05K 2203/304
USPC ......................................................... 361/749
See application file for complete search history.

(56) References Cited

U.S. PATENT DOCUMENTS

| | | | |
|---|---|---|---|
| 4,037,047 A * | 7/1977 | Taylor ................. | H05K 3/4691 174/254 |
| 10,182,474 B2 | 1/2019 | Kim et al. | |

FOREIGN PATENT DOCUMENTS

JP 4945829 6/2012

\* cited by examiner

*Primary Examiner* — Binh B Tran
(74) *Attorney, Agent, or Firm* — F. CHAU & ASSOCIATES, LLC

(57) ABSTRACT

A release film includes a first release film disposed on a printed circuit board and a connector that is connected to the printed circuit board. The first release film comprises a fixing portion having a shape extending in one direction. A second release film is disposed under the printed circuit board. The second release film includes an incision portion. The fixing portion extends into the incision portion.

20 Claims, 24 Drawing Sheets

RELEASE FILM

This application claims priority under 35 U.S.C. § 119 to Korean Patent Application No. 10-2022-0006528, filed on Jan. 17, 2022 in the Korean Intellectual Property Office, the disclosure of which is incorporated by reference in its entirety herein.

1. TECHNICAL FIELD

The present disclosure relates to a release film.

2. DISCUSSION OF RELATED ART

A display device includes a display module to display an image, a supporter to support the display module, and a printed circuit board connected to the display module. The supporter supports the display module and has a rigidity that is greater than that of the display module. The printed circuit board applies a driving signal to the display module to drive the display module. The display module is driven by the printed circuit board and displays the image.

The printed circuit board is typically manufactured separately and is then connected to the display module. Pads of the printed circuit board are connected to pads of the display module for connection to the display module. During the process of transferring the separately manufactured printed circuit board to a process chamber to connect the printed circuit board to the display module, a structure may be utilized to protect the printed circuit board.

SUMMARY

Embodiments of the present disclosure provide a release film capable of protecting a printed circuit board more safely when the printed circuit board is transferred.

According to an embodiment of the present disclosure, a release film includes a first release film disposed on a printed circuit board and a connector that is connected to the printed circuit board. The first release film comprises a fixing portion having a shape extending in one direction. A second release film is disposed under the printed circuit board. The second release film includes an incision portion. The fixing portion extends into the incision portion.

According to an embodiment of the present disclosure, a release film includes a first release film disposed on a printed circuit board and a connector that is connected to the printed circuit board. The first release film comprises a fixing portion having a shape extending in one direction. A second release film is disposed under the printed circuit board. The second release film includes an incision portion. The fixing portion extends into the incision portion and a portion of the fixing portion that is adjacent to a first side of the fixing portion is disposed under the second release film.

According to an embodiment of the present disclosure, a release film includes a first release film disposed on a printed circuit board and a connector that is connected to the printed circuit board. The first release film includes a fixing portion having a first incision portion extending through the first release film in a first direction and defining a first side of the fixing portion and second incision portions extending through the first release film in a second direction crossing the first direction from both ends of the first incision portion. A second release film is disposed under the printed circuit board. The second release film includes an incision portion. The first side of the fixing portion extends into the incision portion and a portion of the fixing portion is disposed under the second release film.

According to the above, the first release film is disposed on a front surface of the printed circuit board, the second release film is disposed on a rear surface of the printed circuit board, and the fixing portion, which is defined by cutting a portion of the first release film, is inserted to the incision portion defined in the second release film. The first release film and the second release film are fixed to each other by the above described structure. Accordingly, the first release film and the second release film are more stably coupled to each other without being separated from each other, and thus, the printed circuit board is safely transferred and connected to a display module.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF EMBODIMENTS

Figure 1:
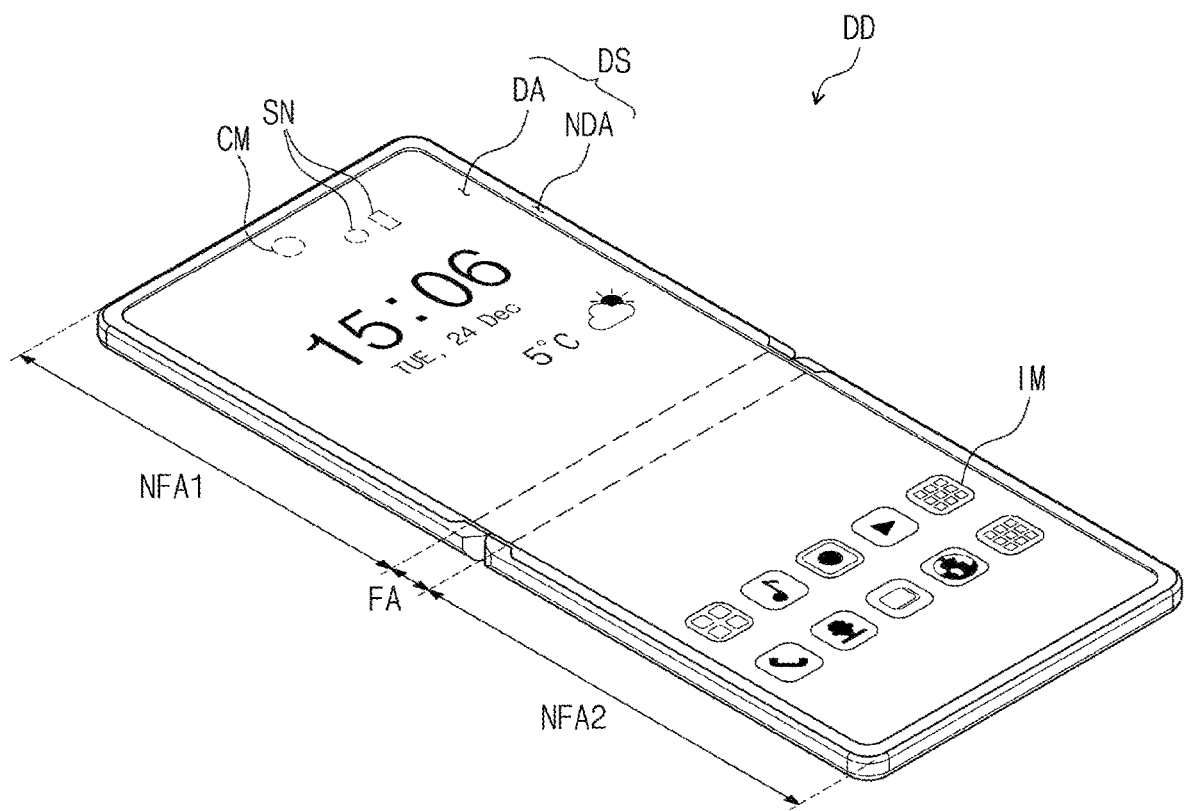
FIG. 1 is a perspective view of a display device manufactured using a printed circuit board protected by a release film according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present. When an element, area, layer, or portion is referred to as being "directly on", "directly connected to" or "directly coupled to" another element or layer, no intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, these elements should not necessarily be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

Figure 2:
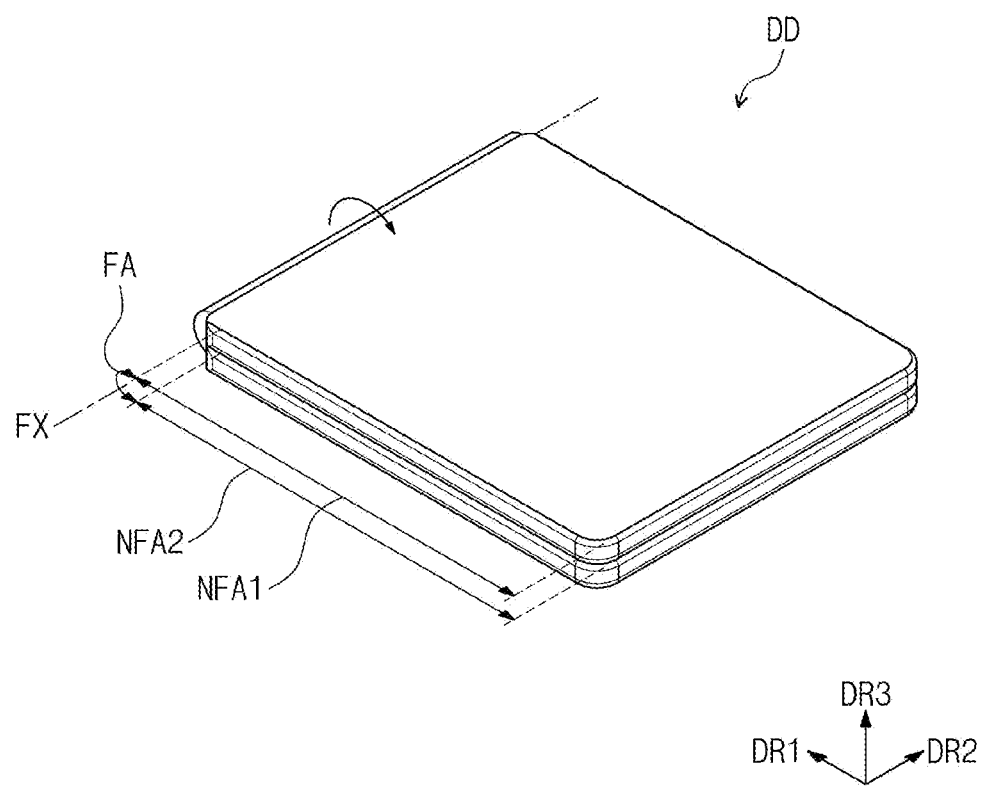
FIG. 2 is a perspective view of a folded state of the display device shown in FIG. 1 according to an embodiment of the present disclosure.

FIG. 1 is a perspective view of a display device DD manufactured using a printed circuit board protected by a release film according to an embodiment of the present disclosure. FIG. 2 is a perspective view of a folded state of the display device DD shown in FIG. 1.

Referring to FIG. 1, in an embodiment the display device DD may have a rectangular shape defined by long sides extending in a first direction DR1 and short sides extending in a second direction DR2 crossing the first direction DR1. However, the shape of the display device DD is not necessarily limited to the rectangular shape, and the display device DD may have various shapes, such as a circular shape and a polygonal shape. The display device DD may be a flexible display device.

Hereinafter, a direction substantially perpendicular to a plane defined by the first direction DR1 and the second direction DR2 may be referred to as a third direction DR3. In the present disclosure, the expression "when viewed in a plane" may mean a state of being viewed in the third direction DR3. In addition, in the present disclosure, the expression "overlap" may mean a state in which components are disposed to overlap each other when viewed in the plane.

The display device DD may include a folding area FA and a plurality of non-folding areas. In an embodiment, the non-folding areas may include a first non-folding area NFA1 and a second non-folding area NFA2. The folding area FA may be disposed between the first non-folding area NFA1 and the second non-folding area NFA2. The second non-folding area NFA2, the folding area FA, and the first non-folding area NFA1 may be arranged in the first direction DR1.

In an embodiment shown in FIG. 1, one folding area FA and two non-folding areas, such as the first and second non-folding areas NFA1 and NFA2, are shown as a representative example, however, the number of the folding areas FA and the number of non-folding areas NFA1 and NFA2 should not necessarily be limited thereto or thereby. For example, the display device DD may include more than two non-folding areas and a plurality of folding areas disposed between the non-folding areas.

An upper surface of the display device DD may be referred to as a display surface DS, and the display surface DS may include a plane defined by the first direction DR1 and the second direction DR2. Images IM generated by the display device DD may be provided to a user through the display surface DS.

The display surface DS may include a display area DA and a non-display area NDA around the display area DA. The display area DA may display the image, and the non-display area NDA may not display the image. The non-display area NDA may surround the display area DA and may define an edge of the display device DD, which is printed by a predetermined color.

The display device DD may include a plurality of sensors SN and at least one camera CM. The sensors SN and the camera CM may be disposed adjacent to an edge of the display device DD. In an embodiment, the sensors SN and the camera CM may be disposed in the display area DA adjacent to the non-display area NDA. For example, the sensors SN and the camera CM may be disposed in the first non-folding area NFA1. However, embodiments of the present disclosure are not necessarily limited thereto and positions of the sensors SN and the camera CM may vary.

As an example, the sensors SN may be a proximity illumination sensor, however, the sensors SN should not necessarily be particularly limited. The camera CM may generate an image of external objects.

Referring to FIG. 2, the display device DD may be a foldable display device DD that is folded or unfolded. The folding area FA may be folded with respect to a folding axis FX substantially parallel to the second direction DR2, and thus, the display device DD may be folded. In an embodiment, the folding axis FX may be defined as a minor axis substantially parallel to the short sides of the display device DD. However, embodiments of the present disclosure are not necessarily limited thereto and the folding axis FX may be variously oriented.

When the display device DD is folded, the first non-folding area NFA1 and the second non-folding area NFA2 may face each other, and thus, the display device DD may be inwardly folded (in-folding) such that the display surface DS may not be exposed to the outside. However, embodiments of the present disclosure are not necessarily limited thereto or thereby. For example, in an embodiment the display device DD may be outwardly folded (out-folding) with respect to the folding axis FX such that the display surface DS may be exposed to the outside.

Figure 3:
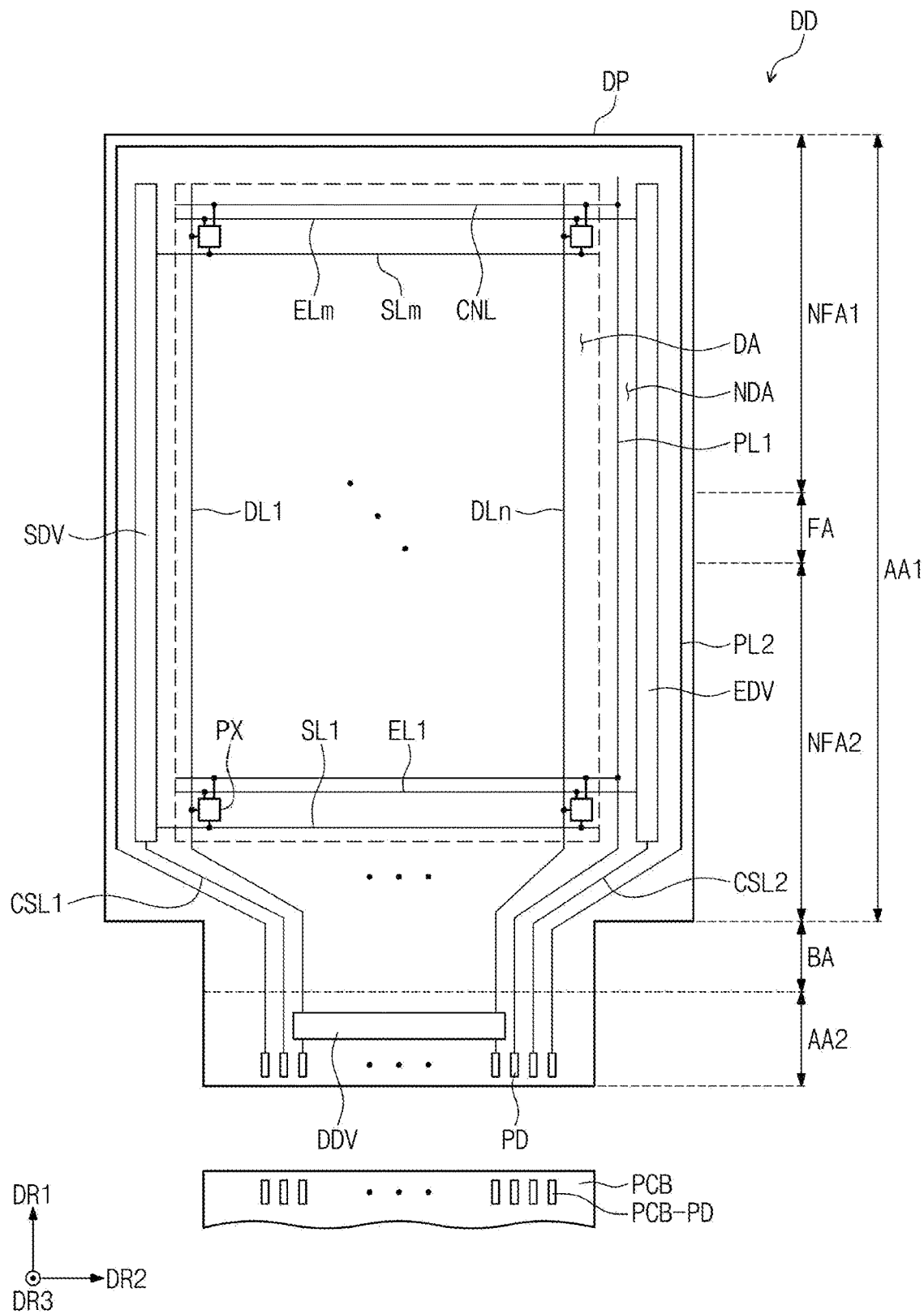
FIG. 3 is a plan view of the display device shown in FIG. 1 according to an embodiment of the present disclosure.

FIG. 3 is a plan view of the display device shown in FIG. 1.

Referring to FIG. 3, the display device DD may include a display panel DP, a scan driver SDV, a data driver DDV, and an emission driver EDV.

According to an embodiment, the display panel DP may be a light emitting type display panel. However, embodiments of the present disclosure are not necessarily limited thereto or thereby. As an example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP for convenience of explanation.

The display panel DP may be a flexible display panel. The display panel DP may extend longer in the first direction DR1 than in the second direction DR2. The display panel DP may include a plane defined by the first and second directions DR1 and DR2.

The display panel DP may include a first area AA1, a second area AA2, and a bending area BA disposed between the first area AA1 and the second area AA2. In an embodiment, the bending area BA may extend in the second direction DR2, and the second area AA2, the bending area BA, and the first area AA1 may be arranged in the first direction DR1.

The first area AA1 may include long sides extending in the first direction DR1 and opposite to each other in the second direction DR2. In an embodiment, lengths of the bending area BA and the second area AA2 in second direction DR2 may be less than that of the first area AA1 in the second direction DR2. However, embodiments of the present disclosure are not necessarily limited thereto.

The first area AA1 may include the display area DA and the non-display area NDA around the display area DA. The non-display area NDA may surround the display area DA. The display area DA may be an area in which the image is displayed, and the non-display area NDA may be an area in which the image is not displayed. The second area AA2 and the bending area BA may be areas in which the image is not displayed.

When viewed in the third direction DR3, the first area AA1 may include the first non-folding area NFA1, the second non-folding area NFA2, and the folding area FA between the first non-folding area NFA1 and the second non-folding area NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, a plurality of connection lines CNL, and a plurality of pads PD. Each of m and n is a natural number. The pixels PX may be arranged in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA to be respectively adjacent to long sides of the first area AA1. For example, in an embodiment, the scan driver SDV may be disposed on the left side of the non-display area NDA (e.g., in the second direction DR2) and the emission driver EDV may be disposed on the right side of the non-display area NDA (e.g., in the second direction DR2). However, embodiments of the present disclosure are not necessarily limited thereto. The data driver DDV may be disposed in the second area AA2. In an embodiment, the data driver DDV may be manufactured in an integrated circuit chip form and may be mounted on the second area AA2.

The scan lines SL1 to SLm may extend in the second direction DR2 and may be connected to the scan driver SDV. The data lines DL1 to DLn may extend in the first direction DR1 and may be connected to the data driver DDV via the bending area BA. The emission lines EL1 to ELm may extend in the second direction DR2 and may be connected to the emission driver EDV.

The first power line PL1 may extend in the first direction DR1 and may be disposed in the non-display area NDA. In an embodiment, the first power line PL1 may be disposed between the display area DA and the emission driver EDV. However, embodiments of the present disclosure are not necessarily limited thereto. For example, in an embodiment the first power line PL1 may be disposed between the display area DA and the scan driver SDV.

The first power line PL1 may extend to the second area AA2 via the bending area BA. In an embodiment, when viewed in the plane, the first power line PL1 may extend to a lower end of the second area AA2. The first power line PL1 may receive a first voltage.

The second power line PL2 may be disposed in the non-display area NDA adjacent to the long sides of the first area AA1 and the non-display area NDA adjacent to an upper side of the display area DA. The second power line PL2 may be arranged outside the scan driver SDV and the emission driver EDV. For example, the second power line PL2 may be arranged closer to an edge of the display device DD than the scan driver SDV and the emission drive EDV.

The second power line PL2 may extend to the second area AA2 via the bending area BA. The second power line PL2 may extend in the first direction DR1 in the second area AA2 such that the data driver DDV may be disposed between both end portions of the second power line PL2. The second power line PL2 may extend to the lower end of the second area AA2 when viewed in the plane.

The second power line PL2 may receive a second voltage having a level lower than that of the first voltage. For the convenience of explanation, a connection relationship is not illustrated, however, the second power line PL2 may extend to the display area DA and may be connected to the pixels PX, and the second voltage may be provided to the pixels PX via the second power line PL2.

The connection lines CNL may extend in the second direction DR2 and may be arranged in the first direction DR1. The connection lines CNL may be connected to the first power line PL1 and the pixels PX. The first voltage may be applied to the pixels PX via the first power line PL1 and the connection lines CNL connected to the first power line PL1.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

In an embodiment, when viewed in the plane, the pads PD may be disposed adjacent to the lower end of the second area AA2. The data driver DDV, the first power line PL1, the second power line PL2, the first control line CSL1, and the second control line CSL2 may be connected to the pads PD.

The data lines DL1 to DLn may be connected to corresponding pads PD via the data driver DDV. As an example, the data lines DL1 to DLn may be connected to the data driver DDV, and the data driver DDV may be connected to the pads PD corresponding to the data lines DL1 to DLn.

The display device DD may include a printed circuit board PCB connected to the pads PD. Connection pads PCB-PD may be disposed on the printed circuit board PCB, and the connection pads PCB-PD may be connected to the pads PD.

A timing controller may be disposed on the printed circuit board PCB. The timing controller may be connected to the pads PD via the printed circuit board PCB. The timing controller may control an operation of the scan driver SDV, the data driver DDV, and the emission driver EDV. The timing controller may generate a scan control signal, a data control signal, and an emission control signal in response to control signals applied thereto from the outside.

In an embodiment, a voltage generator may be disposed on the printed circuit board PCB. The voltage generator may be connected to the pads PD via the printed circuit board PCB. The voltage generator may generate the first voltage and the second voltage. The first voltage and the second voltage may be applied to the pixels PX via the first power line PL1 and the second power line PL2. The pixels PX may be driven by the first and second voltages.

The scan control signal may be applied to the scan driver SDV via the first control line CSL1. The emission control signal may be applied to the emission driver EDV via the second control line CSL2. The data control signal may be applied to the data driver DDV. In an embodiment, the timing controller may receive image signals from the outside, may convert a data format of the image signals to a data format appropriate to an interface between the timing controller and the data driver DDV, and may provide the converted image signals to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines ELI to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

In an embodiment, the printed circuit board PCB may be connected to the display panel DP after being manufactured separately. For example, the printed circuit board PCB may be transferred to a process chamber in which a process of connecting the printed circuit board PCB to the display panel DP is performed. In an embodiment, the printed circuit board PCB may be protected by a release film while being transferred.

Figure 4A:
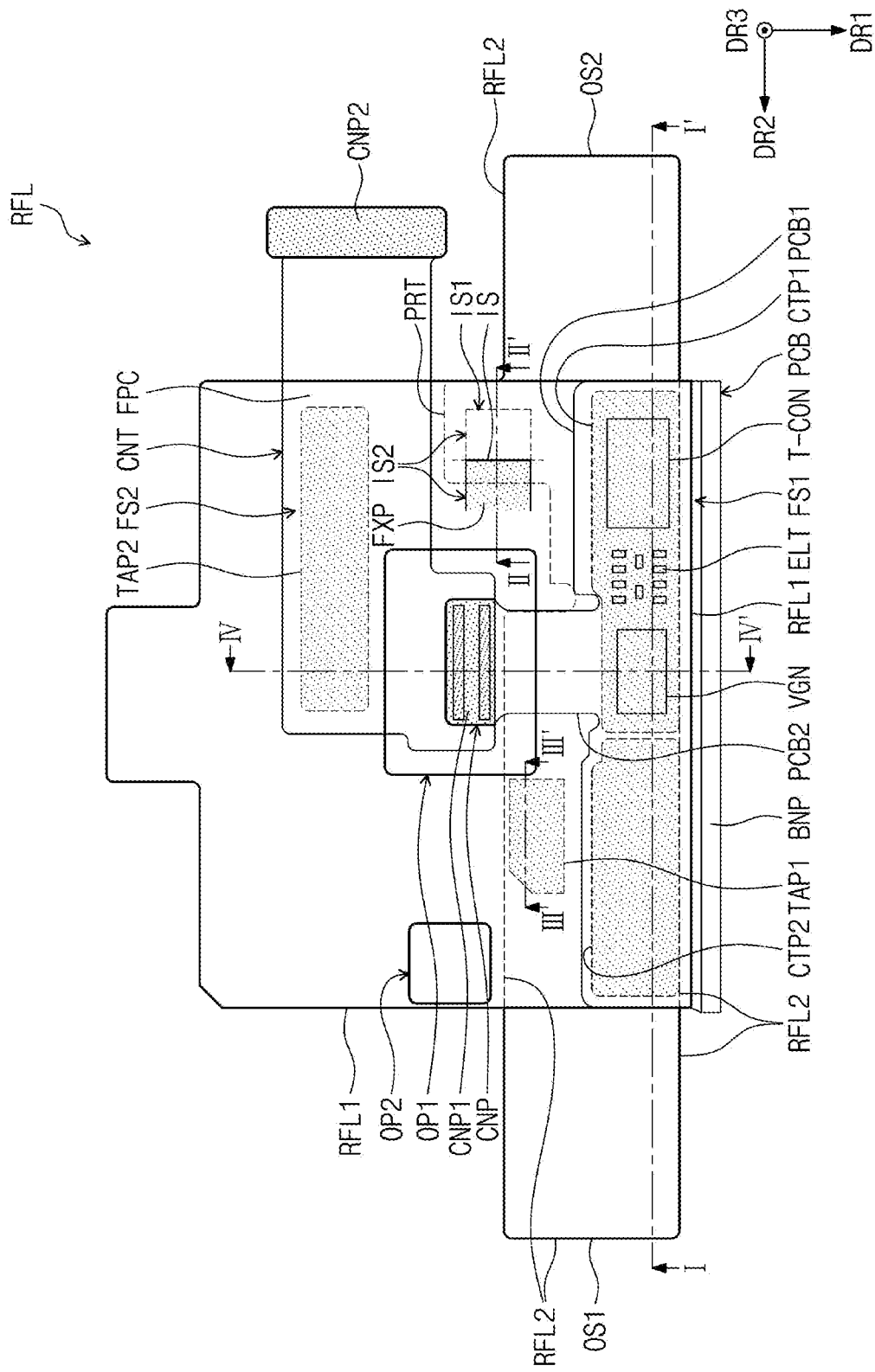
FIG. 4A is a plan view of a front surface of a release film according to an embodiment of the present disclosure.
Figure 4B:
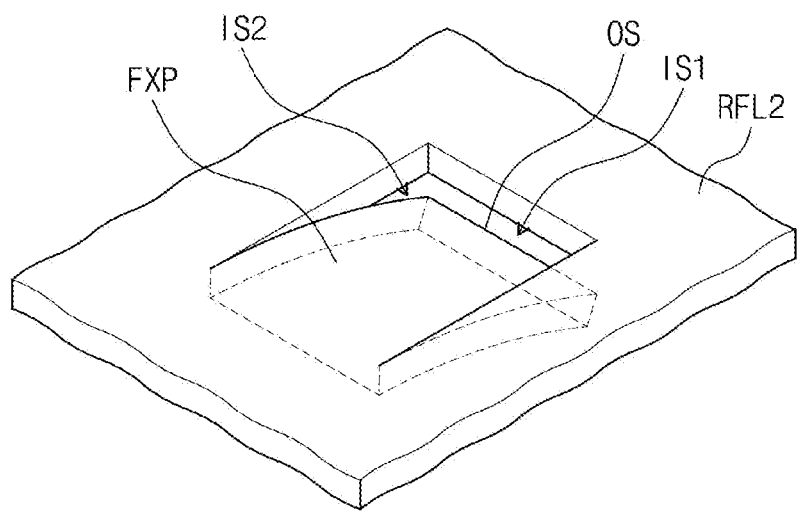
FIG. 4B is an enlarged perspective view of a fixing portion shown in FIG. 4A.
Figure 5:
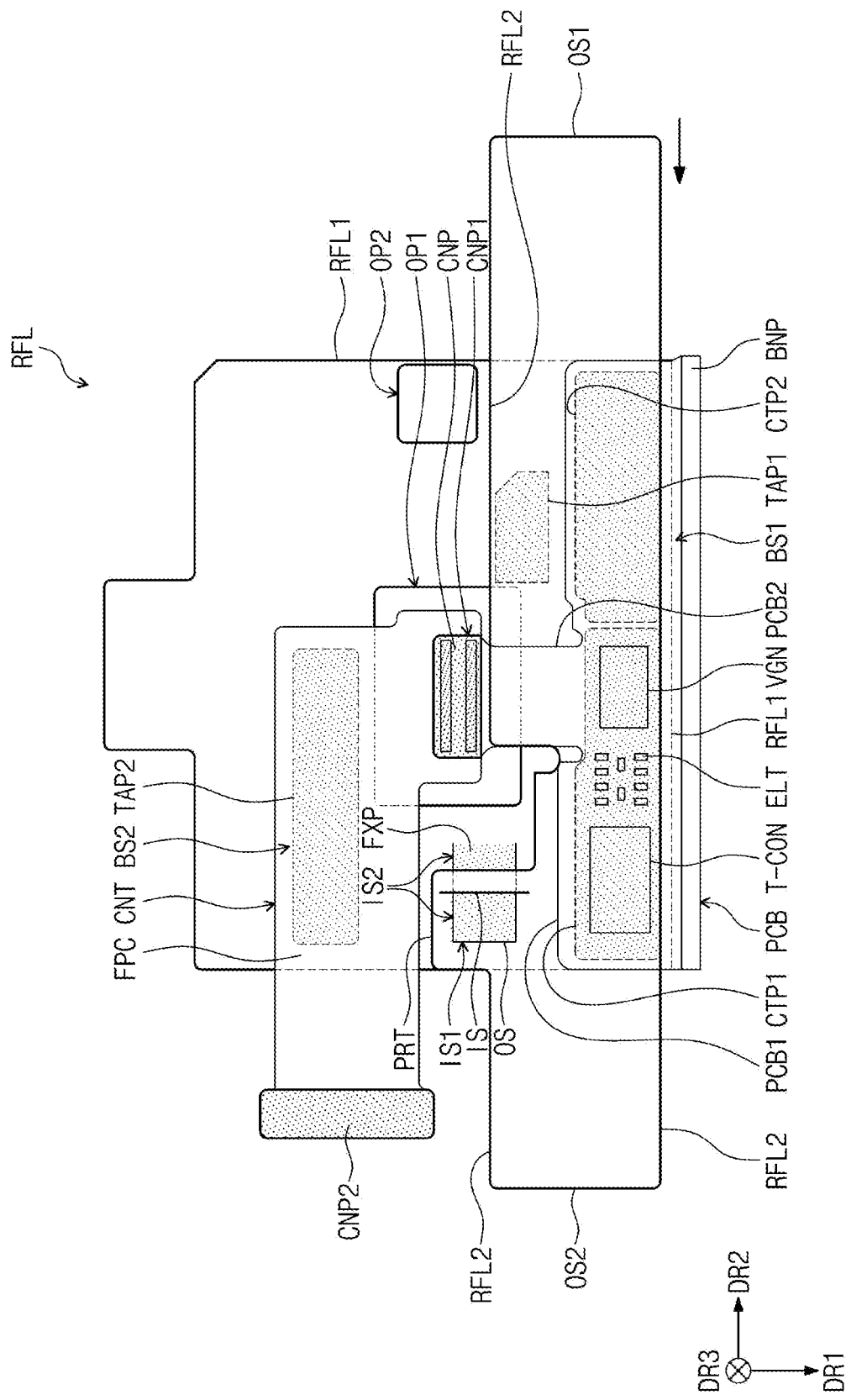
FIG. 5 is a plan view of a rear surface of a release film according to an embodiment of the present disclosure.

FIG. 4A is a plan view of a front surface of a release film RFL according to an embodiment of the present disclosure. FIG. 4B is an enlarged perspective view of a fixing portion FXP shown in FIG. 4A. FIG. 5 is a plan view of a rear surface of the release film RFL according to an embodiment of the present disclosure.

FIG. 4A shows a front surface FS1 of the printed circuit board PCB, and FIG. 5 shows a rear surface BS1 of the printed circuit board PCB. For the convenience of explanation, FIG. 4B shows only the fixing portion FXP of a first release film RFL1.

As an example, in FIGS. 4A and 5, the printed circuit board PCB, a connector CNT, a timing controller T-CON, a voltage generator VGN, and a plurality of elements ELT are shown as a solid line. Components, which are disposed at a relatively lower portion and are covered when viewed in the plane, among components of the display device DD except the above described components are illustrated by a dotted line.

Referring to FIGS. 4A and 5, the printed circuit board PCB may include the front surface FS1 and the rear surface BS1 opposite to the front surface FS1 in the third direction DR3. Each of the front surface FS1 and the rear surface BS1 may include a plane defined by the first and second directions DR1 and DR2.

The connector CNT may be connected to the printed circuit board PCB. The connector CNT may include a front surface FS2 and a rear surface BS2 opposite to the front surface FS2 in the third direction DR3. In an embodiment, each of the front surface FS2 and the rear surface BS2 may include a plane defined by the first and second directions DR1 and DR2.

When viewed in the plane, the printed circuit board PCB may include a first substrate portion PCB1, a second substrate portion PCB2, a contact portion CNP, and a bonding portion BNP. The first substrate portion PCB1 may extend in the second direction DR2.

The second substrate portion PCB2 may extend from a portion of the first substrate portion PCB1 in the first direction DR1. The second substrate portion PCB2 may extend from one side of the first substrate portion PCB1 among both sides of the first substrate portion PCB1, which are opposite to each other in the first direction DR1. The contact portion CNP may be connected to one side of the second substrate portion PCB2.

The bonding portion BNP may be disposed adjacent to the other side of the first substrate portion PCB1 among the both sides of the first substrate portion PCB1, which are opposite to each other in the first direction DR1. For example, as shown in an embodiment of FIG. 4A, the bonding portion BNP may be disposed adjacent to a lower side of the first substrate portion PCB1 (e.g., in the first direction DR1). The first substrate portion PCB1 may be disposed between the bonding portion BNP and the second substrate portion PCB2. The bonding portion BNP may extend in the second direction DR2. The connection pads PCB-PD of the printed circuit board PCB shown in FIG. 3 may be disposed on the bonding portion BNP.

As shown in FIG. 3, one side of the printed circuit board PCB on which the connection pads PCB-PD are disposed may be disposed to face the display panel DP and may be adjacent to the display panel DP. The bonding portion BNP may be defined as a portion of the printed circuit board PCB, which is adjacent to the display panel DP. The bonding portion BNP may be defined as a portion of the printed circuit board PCB, which is adjacent to the one side of the printed circuit board PCB.

The connector CNT may include a flexible circuit film FPC, a first contact portion CNP1, and a second contact portion CNP2. The flexible circuit film FPC may extend in the second direction DR2. The first contact portion CNP1 may be connected to one side of the flexible circuit film FPC. The second contact portion CNP2 may be connected to the other side of the flexible circuit film FPC.

The first contact portion CNP1 may be disposed on the contact portion CNP of the printed circuit board PCB and may overlap the contact portion CNP. The first contact portion CNP1 may be connected to the contact portion CNP. As the first contact portion CNP1 is connected to the contact portion CNP, the connector CNT may be connected to the printed circuit board PCB.

Hereinafter, when looking at the front surfaces FS1 and FS2 in FIG. 4A, structures disposed at a relatively higher position than the front surfaces FS1 and FS2 will be expressed as "structures disposed on the front surfaces FS1 and FS2". When looking at the rear surfaces BS1 and BS2 in FIG. 5, structures disposed at a relatively higher position than the rear surfaces BS1 and BS2 will be expressed as "structures disposed under the rear surface BS1 and BS2". For example, a vertical arrangement relationship between components shown in FIGS. 4A and 5 will be described on the assumption that the front surfaces FS1 and FS2 face an upward direction and the rear surfaces BS1 and BS2 face a downward direction with respect to the third direction DR3. In addition, in the present disclosure, the expression "on the front surface of the structure" may mean the expression "on the structure", and the expression "under the rear surface of the structure" may mean the expression "under the structure".

The timing controller T-CON, the voltage generator VGN, and the elements ELT may be disposed on the front surface FS1 of the printed circuit board PCB. In an embodiment, the elements ELT may include a resistor, a capacitor, and the like. The timing controller T-CON, the voltage generator VGN, and the elements ELT may be defined as parts.

A first conductive tape CTP1 and a second conductive tape CTP2 may be disposed under the rear surface BS1 of the printed circuit board PCB. The first conductive tape CTP1 and the second conductive tape CTP2 may extend in the second direction DR2 and may be arranged in the second direction DR2. The first conductive tape CTP1 and the second conductive tape CTP2 may overlap the first substrate portion PCB1.

The timing controller T-CON, the voltage generator VGN, and the elements ELT may overlap the first conductive tape CTP1. The first conductive tape CTP1 and the second conductive tape CTP2 may include a conductive material. In an embodiment, the first conductive tape CTP1 and the second conductive tape CTP2 may be connected to a ground layer disposed in the printed circuit board PCB. The first conductive tape CTP1 and the second conductive tape CTP2 may discharge external static electricity by inducing the external static electricity to a ground.

The release film RFL may cover the front surface FS1 and the rear surface BS1 of the printed circuit board PCB and may protect the printed circuit board PCB. In addition, the release film RFL may cover the front surface FS2 of the connector CNT and may protect the connector CNT.

In an embodiment, the release film RFL may include a first release film RFL1, a second release film RFL2, a first tape TAP1, and a second tape TAP2. The first release film RFL1 may be disposed on the front surface FS1 of the printed circuit board PCB and the front surface FS2 of the connector CNT. The second release film RFL2 may be disposed under the rear surface BS1 of the printed circuit board PCB.

The first release film RFL1 may be disposed to overlap the front surface FS1 of the printed circuit board PCB and the front surface FS2 of the connector CNT. The first release film RFL1 may overlap the first substrate portion PCB1 and the second substrate portion PCB2 and may not overlap the contact portion CNP and the bonding portion BNP. When viewed in the plane, a first opening OP1 may be defined through the first release film RFL1 to expose the contact portion CNP. A portion of the second substrate portion PCB2, which is adjacent to the contact portion CNP, may be exposed through the first opening OP1.

The first release film RFL1 may overlap (e.g., in the third direction DR3) the flexible circuit film FPC and may not overlap the first contact portion CNP1. The first contact portion CNP1 may be exposed through the first opening OP1. A portion of the flexible circuit film FPC, which is adjacent to the first contact portion CNP1, may be exposed through the first opening OP1.

In an embodiment, the flexible circuit film FPC may extend to the outside of the first release film RFL1 in the second direction DR2. The second contact portion CNP2 and a portion of the flexible circuit film FPC, which is adjacent to the second contact portion CNP2, may be disposed outside the first release film RFL1, and thus, may not overlap the first release film RFL1 (e.g., in the third direction DR3).

A second opening OP2 may be defined through the first release film RFL1. In an embodiment, the second opening OP2 may be adjacent to the second conductive tape CTP2 in the first direction DR1. The second opening OP2 may not overlap the second release film RFL2. Functions of the second opening OP2 will be described below.

The second release film RFL2 may extend in the second direction DR2. The second release film RFL2 may be disposed under the rear surface BS1 of the printed circuit board PCB. The second release film RFL2 may extend to the outside of the first release film RFL1 in the second direction DR2. The second release film RFL2 may overlap the first substrate portion PCB1 and the second substrate portion PCB2 and may not overlap the contact portion CNP and the bonding portion BNP. The second release film RFL2 may overlap the first conductive tape CTP1 and the second conductive tape CTP2.

An incision portion IS extending in the first direction DR1 may be defined in the second release film RFL2. In an embodiment, the second release film RFL2 may include a protruding portion PRT protruding in the first direction DR1, and the incision portion IS may be defined in the protruding portion PRT along the first direction DR1.

The protruding portion PRT may be protruded from a portion of the second release film RFL2, which overlaps the first conductive tape CTP1, and protrudes in the first direction DR1. The protruding portion PRT may not overlap the printed circuit board PCB and the connector CNT. The protruding portion PRT may be disposed between the first substrate portion PCB1, the second substrate portion PCB2, and the flexible circuit film FPC (e.g., in the first direction DR1).

The first tape TAP1 may overlap the second release film RFL2. In an embodiment, the first tape TAP1 may be disposed adjacent to the second conductive tape CTP2 in the first direction DR1. The first tape TAP1 may be adjacent to the second opening OP2. The second tape TAP2 may extend in the second direction DR2 and may overlap the flexible circuit film FPC.

Referring to FIGS. 4A, 4B, and 5, the first release film RFL1 may include the fixing portion FXP defined by cutting a portion of the first release film RFL1, which does not overlap the printed circuit board PCB or the connector CNT. For example, the fixing portion FXP may be a tab formed by cutting a portion of the first release film RFL1. As an example, the fixing portion FXP is shown as a shaded area in FIGS. 4A and 5. The fixing portion FXP may be defined to have a shape extending in one direction. For example, in an embodiment fixing portion FXP may extend in the second direction DR2. However, embodiments of the present disclosure are not necessarily limited thereto. The fixing portion FXP may be disposed adjacent to the first conductive tape CTP1 in the first direction DR1.

The fixing portion FXP may be defined by a first incision portion IS1 cut along the first direction DR1 and second incision portions IS2 cut along the second direction DR2 from both ends of the first incision portion IS1 in the first release film RFL1. One side OS of the fixing portion FXP may be defined by the first incision portion IS1.

When viewed in the plane, the fixing portion FXP may overlap a portion of the protruding portion PRT of the second release film RFL2 starting from an outer portion of the protruding portion PRT. When viewed in the plane, the one side OS of the fixing portion FXP may overlap the protruding portion PRT. The fixing portion FXP may be inserted into (e.g., extend into) the incision portion IS. The one side OS of the fixing portion FXP may be disposed under the second release film RFL2. For example, the fixing portion FXP may comprise a tab of the first release film RFL1 formed by the first incision portion IS1 and the second incision portions IS2 that extends into the incision portion IS of the second release film RFL2 which forms a slot.

When viewed in the plane, the second substrate portion PCB2 may be disposed between the fixing portion FXP and the second opening OP2 in the second direction DR2. When viewed in the plane, the first opening OP1 may be defined between the fixing portion FXP and the second opening OP2.

Figure 6A:
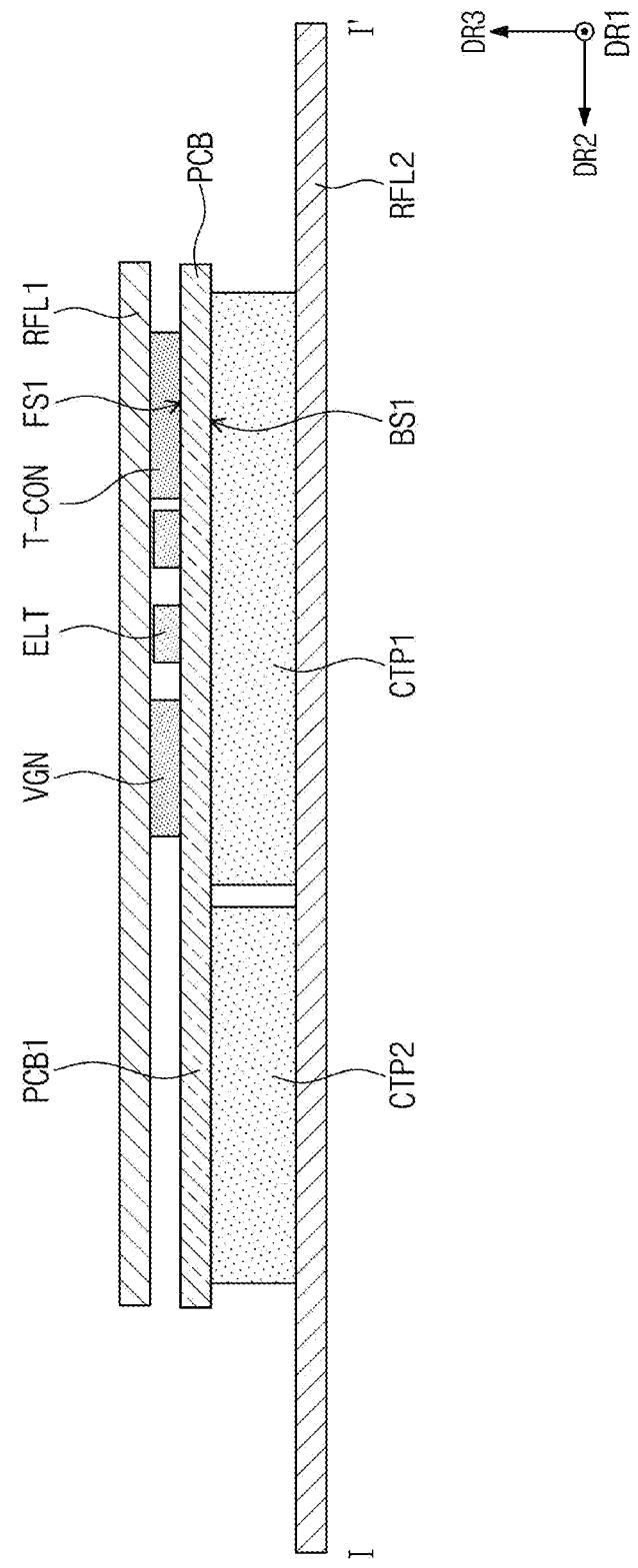
FIGS. 6A and 6B are cross-sectional views of a release film taken along a line I-I' of FIG. 4A according to embodiments of the present disclosure.
Figure 6B:
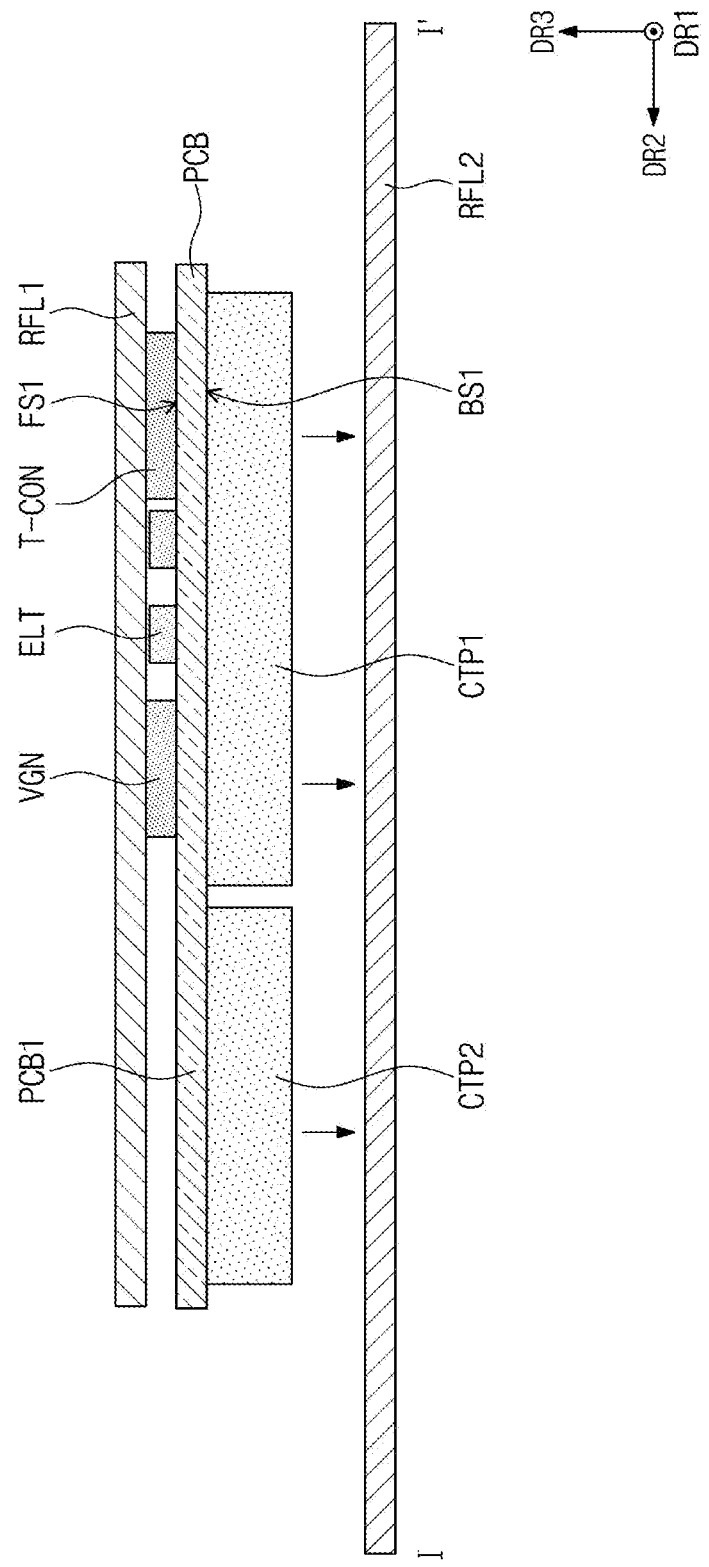
Figure 7A:
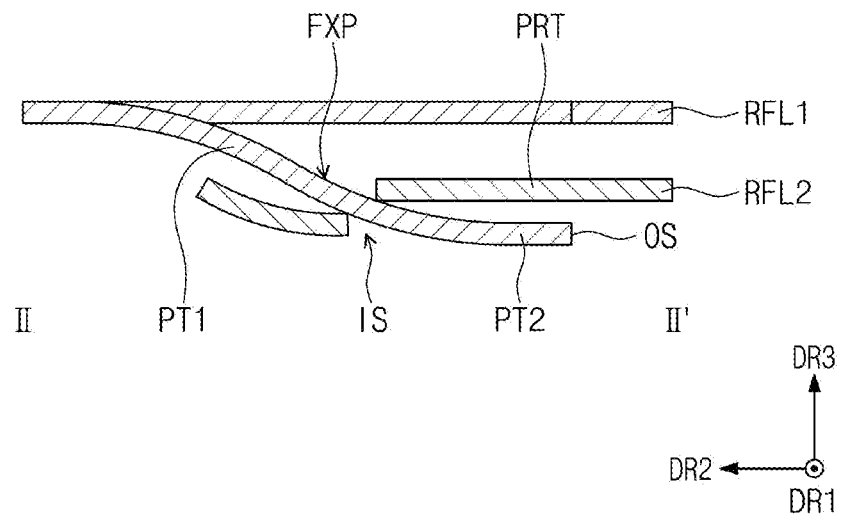
FIGS. 7A and 7B are cross-sectional views of a release film taken along a line II-II' of FIG. 4A according to embodiments of the present disclosure.
Figure 7B:
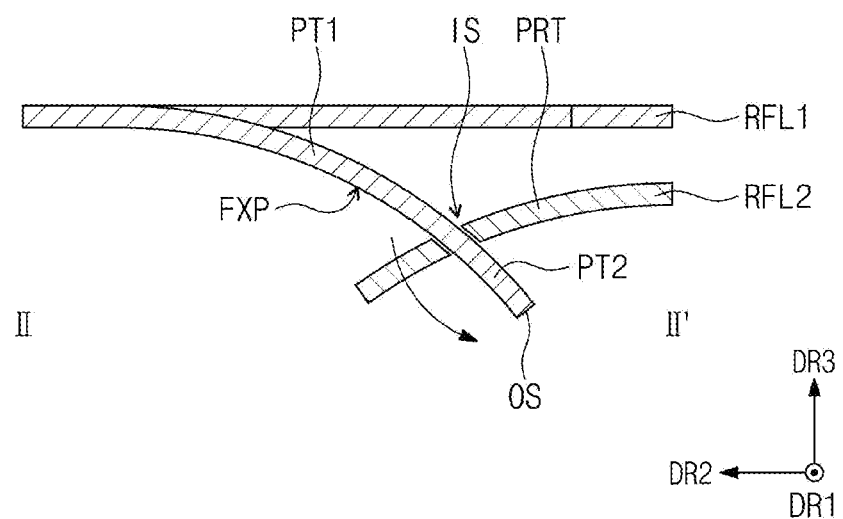
Figure 8A:
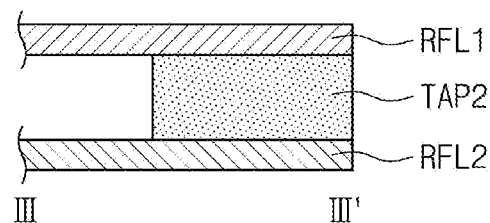
FIGS. 8A and 8B are cross-sectional views of a release film taken along a line III-III' of FIG. 4A according to embodiments of the present disclosure.
Figure 8A:
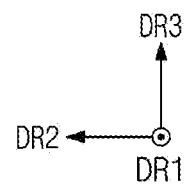
Figure 8B:
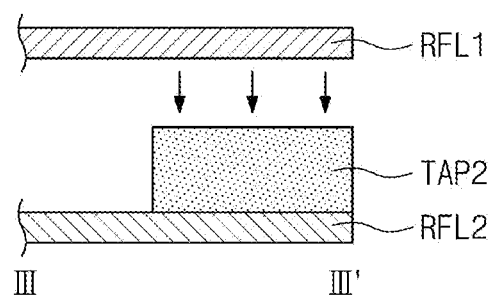
Figure 8B:
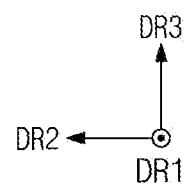
Figure 9:
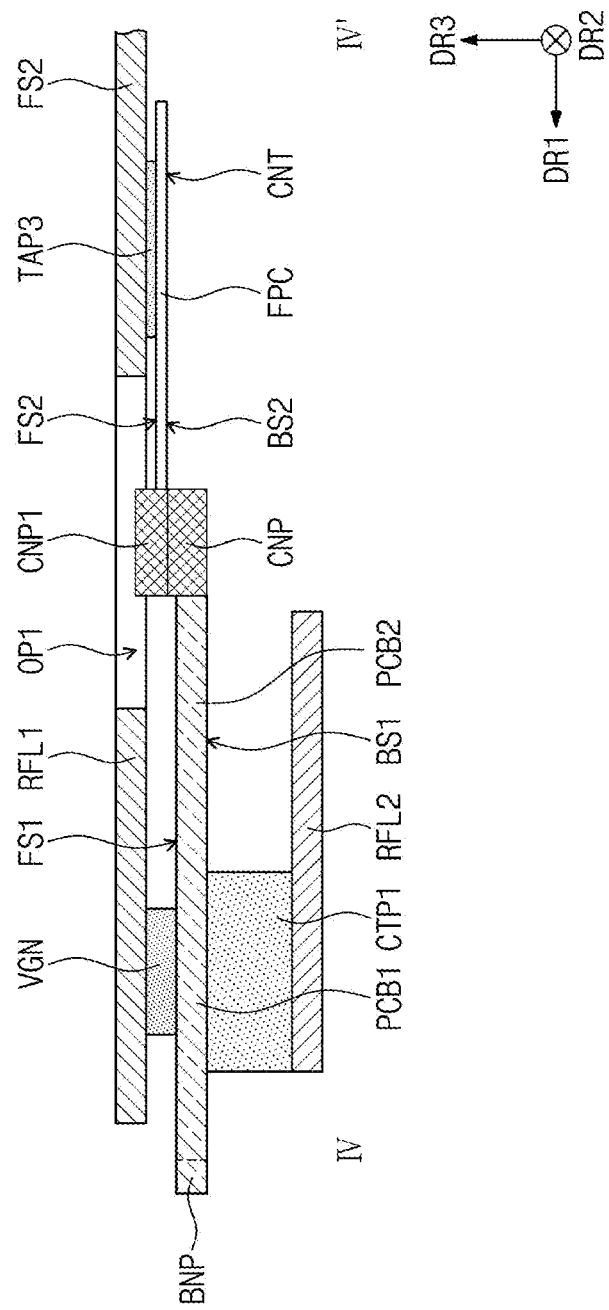
FIG. 9 is a cross-sectional view of a release film taken along a line IV-IV' of FIG. 4A according to an embodiment of the present disclosure.

FIGS. 6A and 6B are cross-sectional views taken along a line I-I' of FIG. 4A. FIGS. 7A and 7B are cross-sectional views taken along a line II-II' of FIG. 4A. FIGS. 8A and 8B are cross-sectional views taken along a line III-III' of FIG. 4A. FIG. 9 is a cross-sectional view taken along a line IV-IV' of FIG. 4A.

Hereinafter, for the convenience of explanation, FIGS. 6A to 9 show components corresponding to section lines only.

Referring to FIGS. 4A, 5, and 6A, the timing controller T-CON, the voltage generator VGN, and the elements ELT may be disposed on the first substrate portion PCB1. The timing controller T-CON, the voltage generator VGN, and the elements ELT may be disposed on the front surface FS1 of the first substrate portion PCB1 overlapping the first conductive tape CTP1.

The first release film RFL1 may be disposed on the front surface FS1 of the first substrate portion PCB1 and may cover the front surface FS1 of the first substrate portion PCB1. In an embodiment, the first release film RFL1 may be disposed on the timing controller T-CON, the voltage generator VGN, and the elements ELT and may cover the timing controller T-CON, the voltage generator VGN, and the elements ELT. The timing controller T-CON, the voltage generator VGN, and the elements ELT may be protected by the first release film RFL1.

The first conductive tape CTP1 and the second conductive tape CTP2 may be disposed under the rear surface BS1 of the first substrate portion PCB1 and may be arranged in the second direction DR2. The first conductive tape CTP1 and the second conductive tape CTP2 may be attached to the rear surface BS1 of the first substrate portion PCB1.

The second release film RFL2 may be disposed under the rear surface BS1 of the first substrate portion PCB1 and may cover the rear surface BS1 of the first substrate portion PCB1. The second release film RFL2 may be disposed under the first conductive tape CTP1 and the second conductive tape CTP2 and may cover the first conductive tape CTP1 and the second conductive tape CTP2. The first conductive tape CTP1 and the second conductive tape CTP2 may be protected by the second release film RFL2.

In an embodiment, the first conductive tape CTP1 may include a single-sided tape. As an example, an adhesive may be disposed on a front surface of the first conductive tape CTP1, which faces the first substrate portion PCB1, and the adhesive may not be disposed on a rear surface of the first conductive tape CTP1, which is opposite to the front surface of the first conductive tape CTP1. The rear surface of the first conductive tape CTP1 may face the second release film RFL2.

In an embodiment, the second conductive tape CTP2 may include a double-sided tape. As an example, adhesives may be respectively disposed on a front surface of the second conductive tape CTP2, which faces the first substrate portion PCB1, and a rear surface of the second conductive tape CTP2, which is opposite to the front surface of the second conductive tape CTP2. The rear surface of the second conductive tape CTP2 may face the second release film RFL2.

The first conductive tape CTP1 that is the single-sided tape may be attached to the first substrate portion PCB1 and may not be attached to the second release film RFL2. The second conductive tape CTP2 that is the double-sided tape may be attached to the first substrate portion PCB1 and the second release film RFL2.

Referring to FIGS. 4A, 5, and 6B, when the display device DD is manufactured, the second release film RFL2 may be removed from the printed circuit board PCB. As an example, the second release film RFL2 may be removed from the first conductive tape CTP1 and the second conductive tape CTP2.

In an embodiment, an adhesion force of the front surface of the second conductive tape CTP2 facing the printed circuit board PCB may be greater than an adhesion force of the rear surface of the second conductive tape CTP2 facing the second release film RFL2. Accordingly, the second release film RFL2 may be removed from the second conductive tape CTP2. Processes performed after the removal of the second release film RFL2 will be described with reference to FIGS. 18 and 19.

Referring to FIGS. 4A, 5, and 7A, the fixing portion FXP may be inserted into the incision portion IS and may be disposed under the second release film RFL2. The first release film RFL1 may be coupled to the second release film RFL2 by the fixing portion FXP.

The one side OS of the fixing portion FXP of the first release film RFL1 may pass through the incision portion IS on the second release film RFL2 and may be disposed under the second release film RFL2. The portion of the fixing portion FXP, which is adjacent to the one side OS of the fixing portion FXP, may be disposed under the second release film RFL2. The portion of the fixing portion FXP, which passes through the incision portion IS, may support the second release film RFL2.

When viewed in the plane, the fixing portion FXP may include a first portion PT1 (FIG. 7A) disposed from the outer portion of the protruding portion PRT to the incision portion IS and a second portion PT2 (FIG. 7A) disposed from the incision portion IS to the one side OS of the fixing portion FXP. The fixing portion FXP may be inserted into the incision portion IS from above the protruding portion PRT toward below the protruding portion PRT. Accordingly, the first portion PT1 may be disposed on the protruding portion PRT, and the one side OS of the fixing portion FXP and the second portion PT2 may be disposed under the protruding portion PRT.

The second portion PT2 may support the second release film RFL2 under the second release film RFL2 such that the second release film RFL2 may not be separated from the first release film RFL1. Accordingly, the second release film RFL2 may be fixed to the first release film RFL1 by the fixing portion FXP.

Referring to FIGS. 4A, 5, and 7B, the second release film RFL2 may be separated from the first release film RFL1 from one side OS1 of the second release film RFL2 to the other side OS2 of the second release film RFL2 in the second direction DR2. The one side OS1 and the other side OS2 may be defined as both sides of the second release film RFL2, which are opposite to each other in the second direction DR2. The one side OS1 and the other side OS2 may be disposed outside the first release film RFL1 (e.g., in the second direction DR2). The one side OS of the fixing portion FXP may be disposed to face the other side OS2 of the second release film RFL2.

When the second release film RFL2 is separated from the first release film RFL1, the first release film RFL1 may be easily separated from the second release film RFL2 by removing the fixing portion FXP from extending within the incision portion IS so that the second portion PT2 of the fixing portion FXP is outside of the incision portion IS and is above the second release film RFL2. When a process of attaching the printed circuit board PCB to the display panel DP is performed, the second release film RFL2 may be removed from the printed circuit board PCB by an operator. The one side OS1 of the second release film RFL2 disposed outside the first release film RFL1 may be gripped, and thus, the second release film RFL2 may be removed.

Referring to FIGS. 4A, 5, and 8A, the first tape TAP1 may be disposed between the first release film RFL1 and the second release film RFL2 and may be attached to the first release film RFL1 and the second release film RFL2. In an embodiment, the first tape TAP1 may include a double-sided tape.

Referring to FIGS. 4A, 5, and 8B, the first tape TAP1 may be removed together with the second release film RLF2 when the second release film RFL2 is removed from the printed circuit board PCB. As an example, in an embodiment an adhesion force of a front surface of the first tape TAP1, which faces the first release film RFL1, may be less than an adhesion force of a rear surface of the first tape TAP1, which faces the second release film RFL2.

Referring to FIGS. 4A, 5, and 9, the first release film RFL1 may be disposed on the front surface FS2 of the connector CNT and may cover the front surface FS2 of the connector CNT. The first release film RFL1 may be disposed on the front surface FS1 of the first substrate portion PCB1 and the front surface FS1 of the second substrate portion PCB2 and may cover the front surface FS1 of the first substrate portion PCB1 and the front surface FS1 of the second substrate portion PCB2.

The first contact portion CNP1 of the connector CNT may be disposed on the contact portion CNP of the printed circuit board PCB and may be connected to the contact portion CNP. The contact portion CNP and the first contact portion CNP1, which are connected to each other, may be exposed via the first opening OP1 defined through the first release film RFL1. The portion of the second substrate portion PCB2 adjacent to the contact portion CNP and the portion of the flexible circuit film FPC adjacent to the first contact portion CNP1 may be exposed through the first opening OP1.

The second release film RFL2 may be disposed under the rear surface BS1 of the first substrate portion PCB1 and the rear surface BS1 of the second substrate portion PCB2 and may cover the rear surface BS1 of the first substrate portion PCB1 and the rear surface BS1 of the second substrate portion PCB2. The second release film RFL2 may not be disposed under the contact portion CNP. The second release film RFL2 may not be disposed under the rear surface BS2 of the connector CNT. For example, the second release film RFL2 may not cover the rear surface BS2 of the connector CNT.

The first release film RFL1 may not be disposed on the bonding portion BNP. The second release film RFL2 may not be disposed under the bonding portion BNP.

The second tape TAP2 may be disposed between the flexible circuit film FPC and the first release film RFL1 and may be attached to the flexible circuit film FPC and the first release film RFL1. In an embodiment, the second tape TAP2 may include a double-sided tape. The first release film RFL1 may be attached to the flexible circuit film FPC by the second tape TAP2.

According to an embodiment, the printed circuit board PCB may be disposed between the first release film RFL1 and the second release film RFL2, and the fixing portion FXP defined by cutting the portion of the first release film RFL1 to form a tab may be inserted into the incision portion IS defined in the second release film RFL2 which forms a slot. Accordingly, the first release film RFL1 and the second release film RFL2 may be stably coupled to each other without being separated from each other, and thus, the printed circuit board PCB may be more stably transferred.

Figure 10:
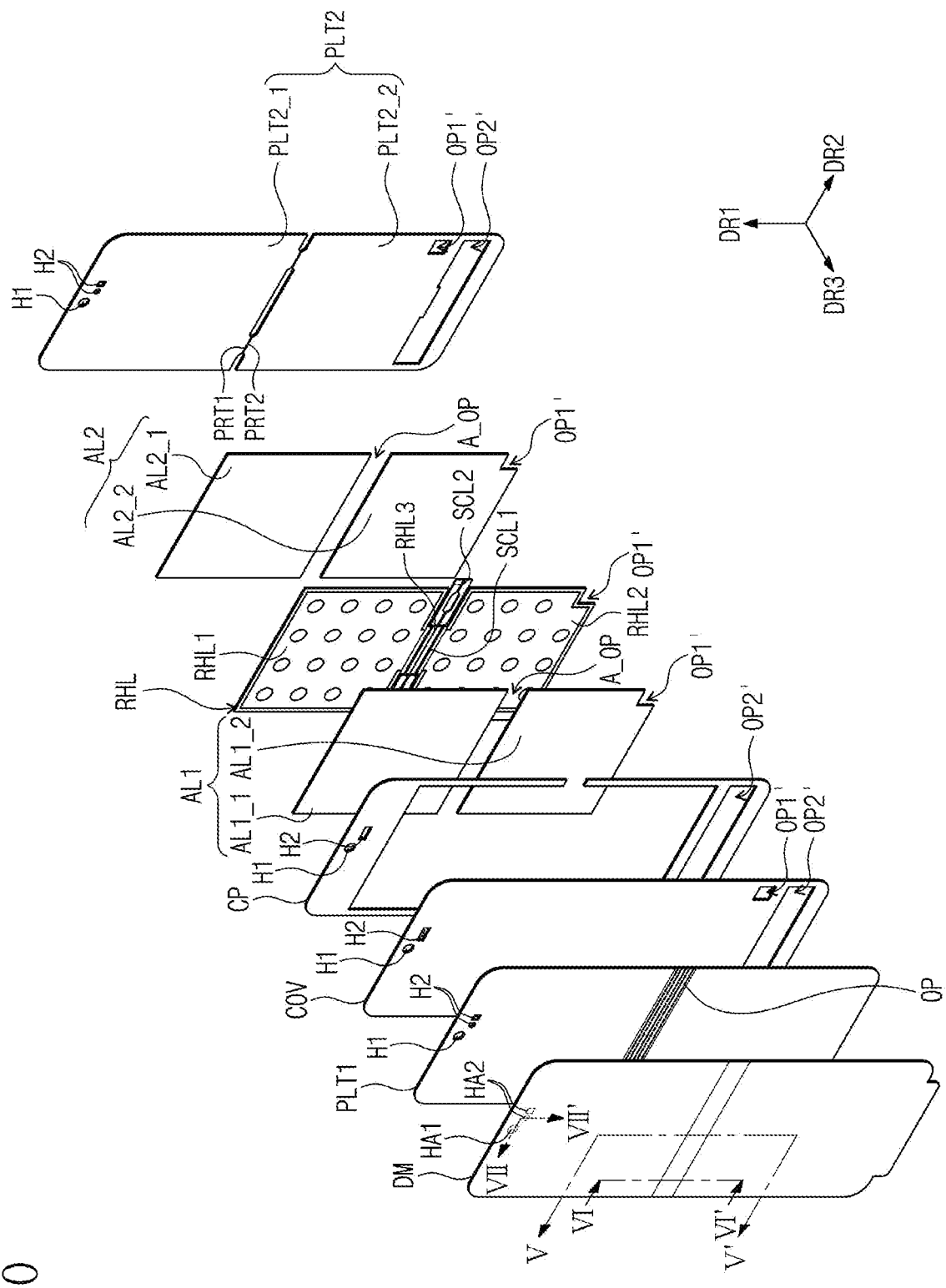
FIG. 10 is an exploded perspective view of the display device shown in FIG. 1 according to an embodiment of the present disclosure.
Figure 11:
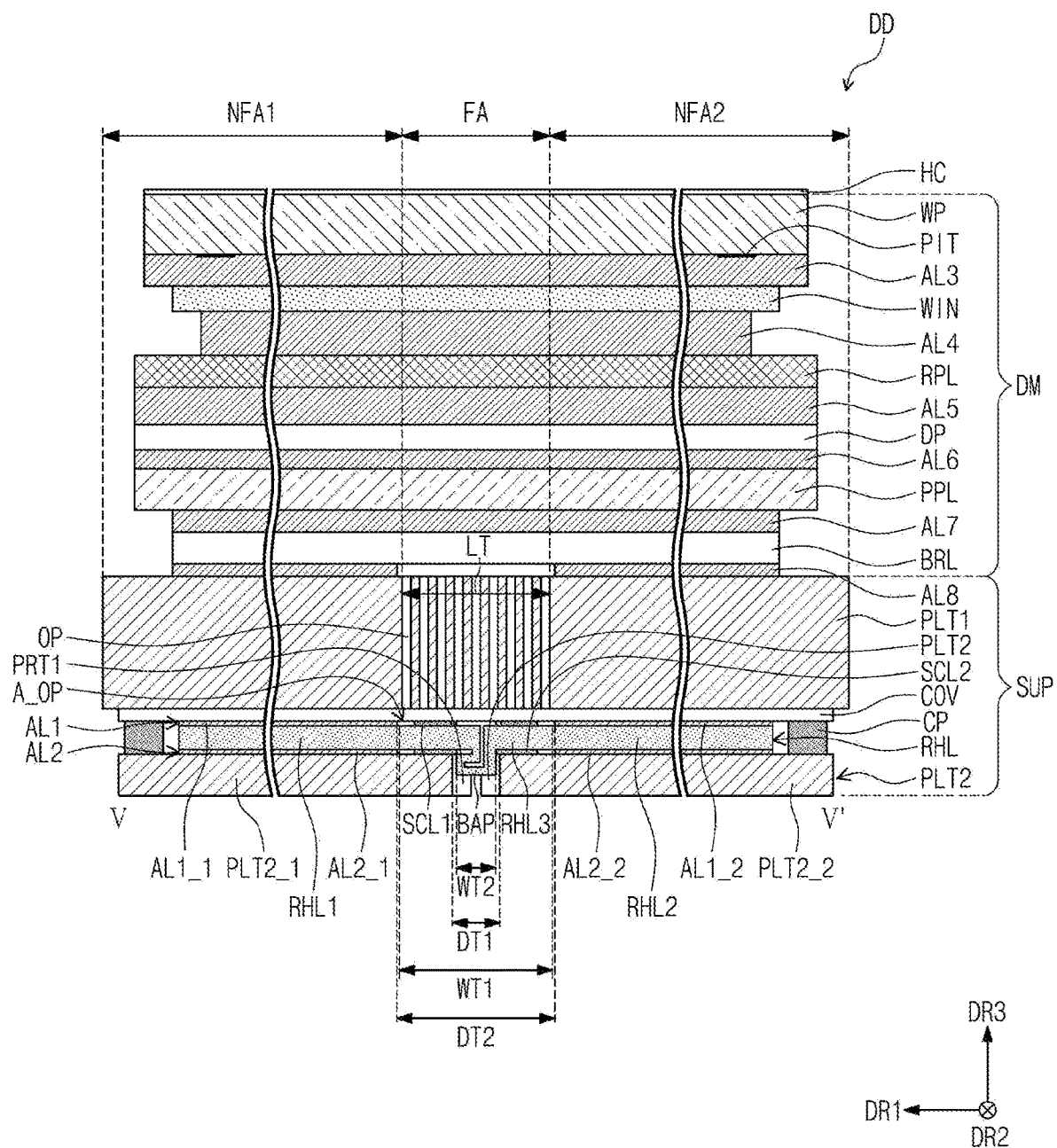
FIG. 11 is a cross-sectional view of a display device taken along a line V-V' of FIG. 10 according to an embodiment of the present disclosure.
Figure 12:
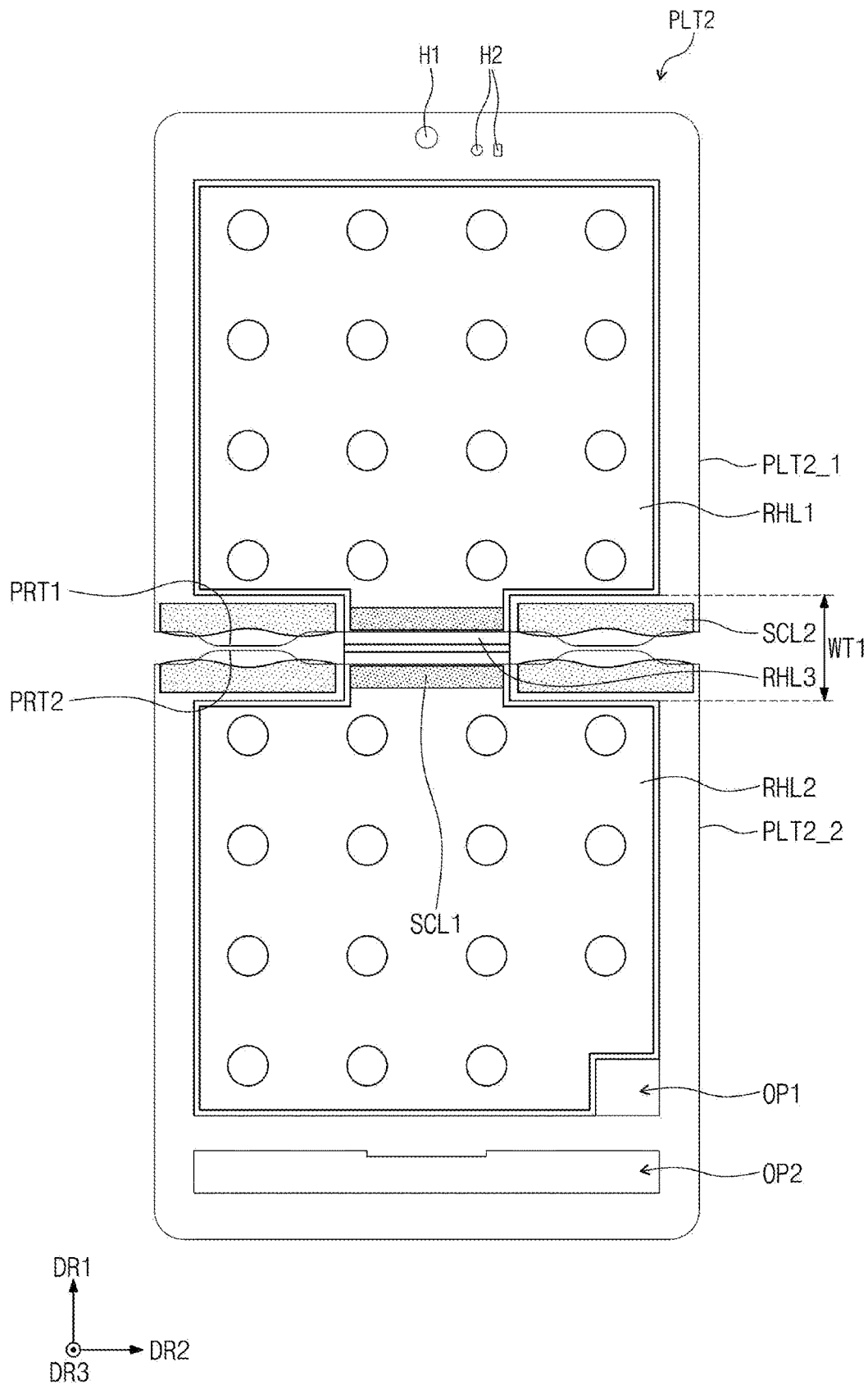
FIG. 12 is a plan view of a heat dissipation layer, a second support plate, and first and second step difference compensation layers of FIG. 10 according to an embodiment of the present disclosure.

FIG. 10 is an exploded perspective view of the display device shown in FIG. 1. FIG. 11 is a cross-sectional view taken along a line V-V' of FIG. 10. FIG. 12 is a plan view of a heat dissipation layer, a second support plate, and first and second step difference compensation layers of FIG. 10.

Referring to FIGS. 10, 11, and 12, the display device DD may include a display module DM and a supporter SUP disposed under the display module DM. The display module DM may be a flexible display module. In an embodiment, the display module DM may include the second non-folding area NFA2, the folding area FA, and the first non-folding area NFA1, which are arranged in the first direction DR1.

At least one first hole area HA1 and a plurality of second hole areas HA2 may be defined through the display module DM. In an embodiment, the camera CM may be disposed in the first hole area HA1, and the sensors SN may be disposed in the second hole areas HA2.

The supporter SUP may be disposed under the display module DM and may support the display module DM. In an embodiment, the supporter SUP may include a first support plate PLT1, a second support plate PLT2, a cover layer COV, a heat dissipation layer RHL, a first adhesive layer AL1, a second adhesive layer AL2, a step difference compensation layer CP, a plurality of first step difference compensation layers SCL1, and a plurality of second step difference compensation layers SCL2.

The first support plate PLT1 may be disposed under the display module DM and may support the display module DM. In an embodiment, the first support plate PLT1 may include a metallic material such as a stainless steel. As an example, the first support plate PLT1 may include SUS 304, however, embodiments of the present disclosure are not necessarily limited thereto and the first support plate PLT1 may include a variety of metallic materials. According to an embodiment, the first support plate PLT1 may include a non-metallic material such as a plastic material.

A plurality of openings OP may be defined through a portion of the first support plate PLT1 overlapping the folding area FA. As the openings OP are defined through the portion of the first support plate PLT1 overlapping the folding area FA, a flexibility of the portion of the first support plate PLT1 overlapping the folding area FA may increase. As an example, the first support plate PLT1 may be easily folded with respect to the folding area FA.

The cover layer COV may be disposed under the first support plate PLT1 and may cover the openings OP defined through the first support plate PLT1. In an embodiment, the cover layer COV may have a modulus of elasticity that is lower than that of the first support plate PLT1. As an example, in an embodiment the cover layer COV may include a thermoplastic polyurethane or a rubber. However, embodiments of the present disclosure are not necessarily limited thereto and a material for the cover layer COV may vary. The cover layer COV may be formed in the form of a sheet and may be attached to the first support plate PLT1.

The second support plate PLT2 may be disposed under the first support plate PLT1. The cover layer COV may be disposed between the first support plate PLT1 and the second support plate PLT2.

In an embodiment, the second support plate PLT2 may include a metallic material such as a stainless steel. However, embodiments of the present disclosure are not necessarily limited thereto and a material of the second support plate PLT2 may vary. For example, in an embodiment, the second support plate PLT2 may include a non-metallic material such as a plastic material.

The second support plate PLT2 may include a second_first support plate PLT2_1 overlapping the first non-folding area NFA1 and a second_second support plate PLT2_2 overlapping the second non-folding area NFA2. The second_first support plate PLT2_1 and the second_second support plate PLT2_2 may be spaced apart from each other in the folding area FA.

The heat dissipation layer RHL may be disposed between the cover layer COV and the second support plate PLT2. A portion of the heat dissipation layer RHL, which overlaps the folding area FA, may be bent and may be disposed between the second_first support plate PLT2_1 and the second_second support plate PLT2_2.

The heat dissipation layer RHL may perform a heat dissipation function. In an embodiment, the heat dissipation layer RHL may include graphite. However, embodiments of the present disclosure are not necessarily limited thereto and a material for the heat dissipation layer RHL may vary. As the heat dissipation layer RHL performs the heat dissipation function together with the first and second support plates PLT1 and PLT2, the heat dissipation performance of the display device DD may be increased.

The heat dissipation layer RHL may include a first heat dissipation portion RHL1, a second heat dissipation portion RHL2, and a third heat dissipation portion RHL3 disposed between the first heat dissipation portion RHL1 and the second heat dissipation portion RHL2 (e.g., in the first direction DR1). The first heat dissipation portion RHL1 may overlap the first non-folding area NFA1, the second heat dissipation portion RHL2 may overlap the second non-folding area NFA2, and the third heat dissipation portion RHL3 may overlap the folding area FA. As shown in FIGS. 10 and 12, the third heat dissipation portion RHL3 may have a width that is less than a width of each of the first and second heat dissipation portions RHL1 and RHL2 in the second direction DR2.

Referring to FIG. 11, a portion of the third heat dissipation portion RHL3 may be bent and may be disposed between the second_first support plate PLT2_1 and the second_second support plate PLT2_2. The bent portion of the third heat dissipation portion RHL3 may be defined as a bending portion BAP.

In FIG. 11, a horizontal direction in an area between two wave line portions indicating an omission may be the first direction DR1. A first distance DT1 in the first direction DR1 between the second_first support plate PLT2_1 and the second_second support plate PLT2_2 may be less than a first width WT1 of the third heat dissipation portion RHL3. A second width WT2 in the first direction DR1 of the bending portion BAP may be less than the first distance DT1.

In an embodiment, the bending portion BAP may protrude lower (e.g., in the third direction DR3) than the first and second heat dissipation portions RHL1 and RHL2 and may be disposed between the second_first support plate PLT2_1 and the second_second support plate PLT2_2. As an example, in an embodiment the bending portion BAP may be bent two times in a downward direction and a left direction. However, the bent shape of the bending portion BAP is not necessarily limited thereto. When the display module DM and the supporter SUP are in an unfolded state, the bending portion BAP may be maintained in the bent state.

The first heat dissipation portion RHL1, the second heat dissipation portion RHL2, and the third heat dissipation portion RHL3 may be formed integrally with each other. When a separate type heat dissipation layer is used, the first heat dissipation portion RHL1 and the second heat dissipation portion RHL2 separated from the first heat dissipation portion RHL1 may be used without employing the third heat dissipation portion RHL3. However, since the integral type heat dissipation layer RHL is used in the present embodiment, the third heat dissipation portion RHL3 may be further disposed in the folding area FA. Accordingly, the heat dissipation performance of the display device DD may be increased.

The third heat dissipation portion RHL3 may be bent and may be disposed in the folding area FA. Accordingly, an area of the heat dissipation layer RHL may be further expanded by the bending portion BAP. Since the heat dissipation performance is proportional to the area of the heat dissipation layer RHL, the heat dissipation performance of the display device DD may be increased.

In an area overlapping the first and second heat dissipation portions RHL1 and RHL2, the second_first support plate PLT2_1 may include first protruding portions PRT1 protruded in the first direction DR1, and the second_second support plate PLT2_2 may include second protruding portions PRT2 protruded in the first direction DR1. The first protruding portions PRT1 and the second protruding portions PRT2 may protrude toward each other and are spaced apart from each other.

According to the above structure, the second_first support plate PLT2_1 and the second_second support plate PLT2_2 may be disposed adjacent to each other in an area overlapping the first and second heat dissipation portions RHL1 and RHL2 and may more easily support the second step difference compensation layers SCL2. In FIG. 12, a distance between the second_first support plate PLT2_1 and the second_second support plate PLT2_2, which are disposed on the third heat dissipation portion RHL3, may be greater than a distance between the first protruding portions PRT1 and the second protruding portions PRT2.

The first adhesive layer AL1 may be disposed between the cover layer COV and the heat dissipation layer RHL. The first adhesive layer AL1 may not be disposed in the folding area FA. The first adhesive layer AL1 may include a first_first adhesive layer AL1_1 overlapping the first non-folding area NFA1 and a first_second adhesive layer AL1_2 overlapping the second non-folding area NFA2.

A second distance DT2 in the first direction DR1 between the first_first adhesive layer AL1_1 and the first_second adhesive layer AL1_2 may be greater than a length LT (e.g., in the first direction DR1) of a portion of the first support plate PLT1 through which the openings OP are defined. The second distance DT2 in the first direction DR1 may be greater than the first width WT1 in the first direction DR1.

The first_first adhesive layer AL1_1 and the first_second adhesive layer AL1_2 may not overlap the folding area FA. In an embodiment, the first_first adhesive layer AL1_1 and the first_second adhesive layer AL1_2 may have substantially the same shape as the first heat dissipation portion RHL1 and the second heat dissipation portion RHL2, respectively. As the first adhesive layer AL1 is not disposed in the folding area FA, the supporter SUP may be more easily folded.

The second adhesive layer AL2 may be disposed between the second support plate PLT2 and the heat dissipation layer RHL. The second adhesive layer AL2 may not be disposed in the folding area FA. The second adhesive layer AL2 may include a second_first adhesive layer AL2_1 overlapping the first non-folding area NFA1 and a second_second adhesive layer AL2_2 overlapping the second non-folding area NFA2. The second distance DT2 in the first direction DR1 between the second_first adhesive layer AL2_1 and the second_second adhesive layer AL2_2 may be greater than the first width WT1.

The second_first adhesive layer AL2_1 and the second_second adhesive layer AL2_2 may not overlap the folding area FA. The second_first adhesive layer AL2_1 and the second_second adhesive layer AL2_2 may have substantially the same shape as the first heat dissipation portion RHL1 and the second heat dissipation portion RHL2, respectively. As the second adhesive layer AL2 is not disposed in the folding area FA, the supporter SUP may be more easily folded.

A space between the first_first adhesive layer AL1_1 and the first_second adhesive layer AL1_2 may be an open portion A_OP of the first adhesive layer AL1 overlapping the folding area FA. A space between the second_first adhesive layer AL2_1 and the second_second adhesive layer AL2_2 may be an open portion A_OP of the second adhesive layer AL2 overlapping the folding area FA. The second distance DT2 may be greater than the first and second widths WT1 and WT2. Accordingly, each of the first and second adhesive layers AL1 and AL2 may be opened with a greater width than that of the third heat dissipation portion RHL3 and the bending portion BAP in the folding area FA.

The step difference compensation layer CP may be disposed between the cover layer COV and the second support plate PLT2. The step difference compensation layer CP may be disposed around an edge of the heat dissipation layer RHL and an edge of each of the first and second adhesive layers AL1 and AL2. In an embodiment, the step difference compensation layer CP may include a double-sided tape.

The heat dissipation layer RHL and the first and second adhesive layers AL1 and AL2 may not be disposed in an area adjacent to an edge of the cover layer COV and an edge of the second support plate PLT2. The step difference compensation layer CP may be disposed adjacent to the edges of the cover layer COV and the second support plate PLT2. The step difference compensation layer CP may surround the heat dissipation layer RHL and the first and second adhesive layers AL1 and AL2.

The step difference compensation layer CP may be disposed between the cover layer COV and the second support plate PLT2 in an area in which the heat dissipation layer RHL and the first and second adhesive layers AL1 and AL2 are not disposed. The step difference compensation layer CP may compensate for a step difference in the area in which the heat dissipation layer RHL and the first and second adhesive layers AL1 and AL2 are not disposed.

The first step difference compensation layers SCL1 may overlap the folding area FA and may be disposed in the open portion A_OP. For example, the first step difference compensation layers SCL1 may be disposed between the first_first adhesive layer AL1_1 and the first_second adhesive layer AL1_2. The first step difference compensation layers SCL1 may be disposed between the heat dissipation layer RHL and the cover layer COV. The first step difference compensation layers SCL1 may compensate for a step difference in the area in which the first adhesive layer AL1 is not disposed.

As shown in FIGS. 10 and 12, the second step difference compensation layers SCL2 may overlap the folding area FA and may be disposed between the first heat dissipation portion RHL1 and the second heat dissipation portion RHL2. The second step difference compensation layers SCL2 may be disposed around the third heat dissipation portion RHL3. The third heat dissipation portion RHL3 may be disposed between the second step difference compensation layers SCL2.

As an example, in an embodiment shown in FIG. 11 two first step difference compensation layers SCL1 and four second step difference compensation layers SCL2 are shown. However, embodiments of the present disclosure are not necessarily limited thereto and the number of the first step difference compensation layers SCL1 and the number of the second step difference compensation layers SCL2 may vary.

Hereinafter, in the present disclosure, the term "thickness" refers to a value (e.g., a length) measured in the third direction DR3. In FIG. 11, the term "width" refers to a value (e.g., a length) measured in the horizontal direction (e.g., the first and/or second directions DR1, DR2 or another direction between the first and second directions DR1, DR2 and perpendicular to the third direction DR3).

Referring to FIG. 11, the first support plate PLT1 may have a thickness that is greater than a thickness of the second support plate PLT2, and the thickness of the second support plate PLT2 may be greater than a thickness of each of the heat dissipation layer RHL and the step difference compensation layer CP. The thickness of the step difference compensation layer CP may be greater than the thickness of the heat dissipation layer RHL. The thickness of the heat dissipation layer RHL may be greater than a thickness of the cover layer COV. The thickness of the cover layer COV may be greater than a thickness of each of the first and second adhesive layers AL1 and AL2.

In an embodiment, the first support plate PLT1 may have a width greater than a width of the second support plate PLT2 and a width of the cover layer COV. The edge of each of the second support plate PLT2 and the cover layer COV may be disposed inside the edge of the first support plate PLT1. The edge of the step difference compensation layer CP may be disposed inside the edge of each of the second support plate PLT2 and the cover layer COV.

In an embodiment, the width of the heat dissipation layer RHL and the width of each of the first and second adhesive layers AL1 and AL2 may be less than the width of the second support plate PLT2 and the width of the cover layer COV. The heat dissipation layer RHL and the first and second adhesive layers AL1 and AL2 may be disposed inside the step difference compensation layer CP.

Referring to FIG. 10, first and second holes H1 and H2 may be defined through each of the first support plate PLT1 and the second support plate PLT2 to overlap the first and second hole areas HA1 and HA2, respectively. The first and second holes H1 and H2 may be defined through each of the cover layer COV and the step difference compensation layer CP. In an embodiment, in each of the cover layer COV and the step difference compensation layer CP, the second holes H2 may be defined integrally. The heat dissipation layer RHL, the first and second adhesive layers AL1 and AL2, and the first and second step difference compensation layers SCL1 and SCL2 may not overlap the first and second holes H1 and H2.

A first opening OP1' and a second opening OP2' may be defined through each of the cover layer COV and the second support plate PLT2. The first opening OP1' may be defined adjacent to the second opening OP2'. The second opening OP2' may be defined through the step difference compensation layer CP. The first opening OP1' may not be defined through the step difference compensation layer CP.

The first opening OP1' may be defined through each of the heat dissipation layer RHL and the first and second adhesive layers AL1 and AL2. For example, portions of the heat dissipation layer RHL and the first and second adhesive layers AL1 and AL2, which overlap the first opening OP1' of the second support plate PLT2, may be removed, and thus, the first openings OP1' may be defined through the heat dissipation layer RHL and the first and second adhesive layers AL1 and AL2. Portions of corners of the heat dissipation layer RHL and the first and second adhesive layers AL1 and AL2 may be removed, and thus, the first openings OP1' may be defined through the heat dissipation layer RHL and the first and the second adhesive layers AL1 and AL2.

Referring to FIGS. 10 and 11, the display module DM may be attached to the supporter SUP. For example, the display module DM may be attached to an upper surface of the first support plate PLT1. The first support plate PLT1 may support the display module DM. Heat generated from the display module DM may be dissipated by the heat dissipation layer RHL, the first support plate PLT1, and the second support plate PLT2.

The second_first support plate PLT2_1 may support the first non-folding area NFA1, and the second_second support plate PLT2_2 may support the second non-folding area NFA2. The second_first support plate PLT2_1 and the second_second support plate PLT2_2 may extend in the folding area FA and may be disposed adjacent to each other in the folding area FA.

The second_first support plate PLT2_1 and the second_second support plate PLT2_2 may support the portion of the first support plate PLT1 through which the openings OP are defined in the folding area FA. When a pressure is applied to the first support plate PLT1 from above the first support plate PLT1, deformation of the portion of the first support plate PLT1 through which the openings OP are defined may be prevented by the second_first support plate PLT2_1 and the second_second support plate PLT2_2.

In an embodiment as shown in FIG. 11, the display module DM may include the display panel DP, an anti-reflective layer RPL, a window WIN, a window protective layer WP, a hard coating layer HC, a panel protective layer PPL, a barrier layer BRL, and third, fourth, fifth, sixth, seventh, and eighth adhesive layers AL3, AL4, AL5, AL6, AL7, and AL8. The anti-reflective layer RPL, the window WIN, the window protective layer WP, and the hard coating layer HC may be disposed on the display panel DP. The panel protective layer PPL and the barrier layer BRL may be disposed under the display panel DP.

The anti-reflective layer RPL may be disposed on the display panel DP. The anti-reflective layer RPL may be an external light reflection prevention film. The anti-reflective layer RPL may reduce a reflectance with respect to an external light incident to the display panel DP from the outside.

In a case where the external light incident to the display panel DP is provided to the user after being reflected by the display panel DP, the user may perceive the external light. The anti-reflective layer RPL may include color filters CF that display the same colors as those of the pixels to prevent the above-mentioned phenomenon.

In an embodiment, the color filters may filter the external light such that the external light may have the same colors as those of the pixels. In this embodiment, the reflected external light may not be perceived by the user. However, embodiments of the present disclosure are not necessarily limited thereto or thereby, and the anti-reflective layer RPL may include a retarder and/or a polarizer to reduce the reflectance with respect to the external light.

The window WIN may be disposed on the anti-reflective layer RPL. The window WIN may protect the display panel DP and the anti-reflective layer RPL from external scratches. The window WIN may have an optically transparent property. In an embodiment, the window WIN may include a glass material. However, embodiments of the present disclosure are not necessarily limited thereto and the material of the window WIN may vary. For example, in an embodiment, the window WIN may include a synthetic resin film.

The window WIN may have a single-layer or multi-layer structure. As an example, in an embodiment the window WIN may include a plurality of synthetic resin films attached to each other by an adhesive or a glass substrate and the synthetic resin film attached to the glass substrate by an adhesive.

The window protective layer WP may be disposed on the window WIN. In an embodiment, the window protective layer WP may include a flexible plastic material, such as polyimide (PI) or polyethylene terephthalate (PET). However, embodiments of the present disclosure are not necessarily limited thereto. The hard coating layer HC may be disposed on an upper surface of the window protective layer WP.

A print layer PIT may be disposed on a lower surface of the window protective layer WP. In an embodiment, the print layer PIT may have a black color. However, embodiments of the present disclosure are not necessarily limited thereto and the color of the print layer PIT may vary. The print layer PIT may be disposed adjacent to an edge of the window protective layer WP.

The third adhesive layer AL3 may be disposed between the window protective layer WP and the window WIN. The window protective layer WP may be coupled to the window WIN by the third adhesive layer AL3. The third adhesive layer AL3 may cover the print layer PIT.

The fourth adhesive layer AL4 may be disposed between the window WIN and the anti-reflective layer RPL. The window WIN may be coupled to the anti-reflective layer RPL by the fourth adhesive layer AL4. The fifth adhesive layer AL5 may be disposed between the anti-reflective layer RPL and the display panel DP. The anti-reflective layer RPL may be coupled to the display panel DP by the fifth adhesive layer AL5.

The panel protective layer PPL may be disposed under the display panel DP. The panel protective layer PPL may protect a lower portion of the display panel DP. In an embodiment, the panel protective layer PPL may include a flexible plastic material. As an example, the panel protective layer PPL may include polyethylene terephthalate (PET). However, embodiments of the present disclosure are not necessarily limited thereto.

The barrier layer BRL may be disposed under the panel protective layer PPL. The barrier layer BRL may increase a resistance to a compressive force caused by an external pressure. Accordingly, the barrier layer BRL may prevent the display panel DP from being deformed. In an embodiment, the barrier layer BRL may include the flexible plastic material, such as polyimide or polyethylene terephthalate. However, embodiments of the present disclosure are not necessarily limited thereto.

The barrier layer BRL may have a color absorbing the light. As an example, the barrier layer BRL may have a black color. In this embodiment, when the display module DM is viewed from the top of the display module DM, components disposed under the barrier layer BRL may not be visible to the user.

The sixth adhesive layer AL6 may be disposed between the display panel DP and the panel protective layer PPL. The display panel DP and the panel protective layer PPL may be coupled to each other by the sixth adhesive layer AL6. The seventh adhesive layer AL7 may be disposed between the panel protective layer PPL and the barrier layer BRL. The panel protective layer PPL and the barrier layer BRL may be coupled to each other by the seventh adhesive layer AL7.

The eighth adhesive layer AL8 may be disposed between the barrier layer BRL and the first support plate PLT1. The barrier layer BRL and the first support plate PLT1 may be coupled to each other by the eighth adhesive layer AL8. The eighth adhesive layer AL8 may not overlap the folding area FA. For example, the eighth adhesive layer AL8 may not be disposed in the folding area FA.

In an embodiment, the first to eighth adhesive layers AL1 to AL8 may include a transparent adhesive such as a pressure sensitive adhesive (PSA) or an optically clear adhesive (OCA). However, embodiments of the present disclosure are not necessarily limited thereto and the material of the adhesive of the first to eight adhesive layers AL1 to AL8 may vary.

In an embodiment, the panel protective layer PPL may have a thickness that is less than a thickness of the window protective layer WP, and the anti-reflective layer RPL may have a thickness that is less than the thickness of the panel protective layer PPL. The display panel DP may have a thickness that is less than the thickness of the anti-reflective layer RPL. A thickness of the window WIN may be the same as the thickness of the anti-reflective layer RPL. A thickness of the barrier layer BRL may be less than the thickness of the panel protective layer PPL and may be greater than the thickness of the anti-reflective layer RPL.

In an embodiment, the third adhesive layer AL3 may have a thickness equal to the thickness of the barrier layer BRL, and each of the fourth adhesive layer AL4 and the fifth adhesive layer AL5 may have a thickness equal to the thickness of the panel protective layer PPL. Each of the sixth adhesive layer AL6 and the seventh adhesive layer AL7 may have a thickness that is less than the thickness of the display panel DP. The sixth adhesive layer AL6 and the seventh adhesive layer AL7 may have the same thickness as each other.

The eighth adhesive layer AL8 may have a thickness that is less than the thickness of each of the sixth adhesive layer AL6 and the seventh adhesive layer AL7, and a thickness of the hard coating layer HC may be less than the thickness of the eighth adhesive layer AL8. The thickness of each of the first and second adhesive layers AL1 and AL2 may be less than the thickness of the hard coating layer HC.

The width of the first support plate PLT1 may be greater than a width of the display module DM. An edge of the display module DM may be disposed inside the edge of the first support plate PLT1. In an embodiment, the display panel DP, the anti-reflective layer RPL, the panel protective layer PPL, and the fifth and sixth adhesive layers AL5 and AL6 may have the same width as each other. The window protective layer WP and the third adhesive layer AL3 may have the same width as each other.

In an embodiment, the widths of the display panel DP, the anti-reflective layer RPL, the panel protective layer PPL, and the fifth and sixth adhesive layers AL5 and AL6 may be greater than the widths of the window protective layer WP and the third adhesive layer AL3. The edges of the display panel DP, the anti-reflective layer RPL, the panel protective layer PPL, and the fifth and sixth adhesive layers AL5 and AL6 may be disposed outside the edges of the window protective layer WP and the third adhesive layer AL3.

In an embodiment, the widths of the window WIN and the fourth adhesive layer AL4 may be less than the widths of the window protective layer WP and the third adhesive layer AL3. The width of the fourth adhesive layer AL4 may be less than the width of the window WIN. The edge of the window WIN may be disposed inside the edges of the window protective layer WP and the third adhesive layer AL3. The edge of the fourth adhesive layer AL4 may be disposed inside the edge of the window WIN.

The barrier layer BRL and the seventh and eighth adhesive layers AL7 and AL8 may have the same width as each other. The edges of the barrier layer BRL and the seventh and eighth adhesive layers AL7 and AL8 may be disposed inside the edges of the display panel DP, the anti-reflective layer RPL, the panel protective layer PPL, and the fifth and sixth adhesive layers AL5 and AL6.

Figure 13:
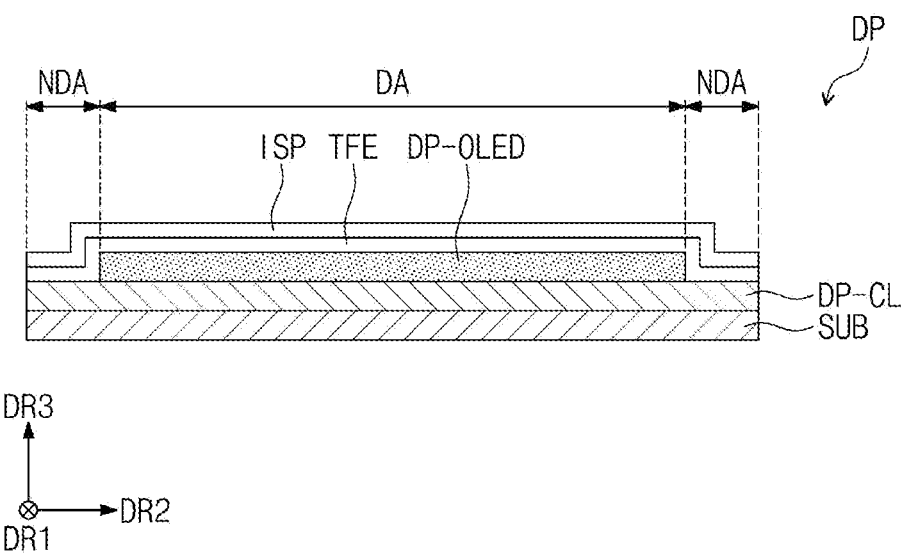
FIG. 13 is a cross-sectional view of a display panel of FIG. 11 according to an embodiment of the present disclosure.

FIG. 13 is a cross-sectional view of the display panel DP of FIG. 11.

Referring to FIG. 13, in an embodiment the display panel DP may include a substrate SUB, a circuit element layer DP-CL disposed on the substrate SUB, a display element layer DP-OLED disposed on the circuit element layer DP-CL, a thin film encapsulation layer TFE disposed on the display element layer DP-OLED, and an input sensing part ISP disposed on the thin film encapsulation layer TFE. The display element layer DP-OLED may be disposed in the display area DA.

The substrate SUB may include a display area DA and a non-display area NDA around the display area DA (e.g., in the first and/or second directions DR1, DR2). In an embodiment, the substrate SUB may include a flexible plastic material. As an example, the substrate SUB may include polyimide (PI). However, embodiments of the present disclosure are not necessarily limited thereto.

The pixels PX may be disposed in the circuit element layer DP-CL and the display element layer DP-OLED. Each of the pixels PX may include transistors disposed in the circuit element layer DP-CL and light emitting elements disposed in the display element layer DP-OLED and connected to the transistors.

The thin film encapsulation layer TFE may be disposed on the circuit element layer DP-CL to cover the display element layer DP-OLED. The thin film encapsulation layer TFE may protect the pixels PX from moisture, oxygen, and a foreign substance such as a dust particle.

The input sensing part ISP may include a plurality of sensors to sense an external input. In an embodiment, the sensors may sense the external input by a capacitance method. In an embodiment, the input sensing part ISP may be directly formed on the thin film encapsulation layer TFE when the display panel DP is manufactured. However, embodiments of the present disclosure are not necessarily limited thereto. For example, in an embodiment, the input sensing part ISP may be manufactured separately from the display panel DP and may be attached to the display panel DP by the adhesive layer.

Figure 14:
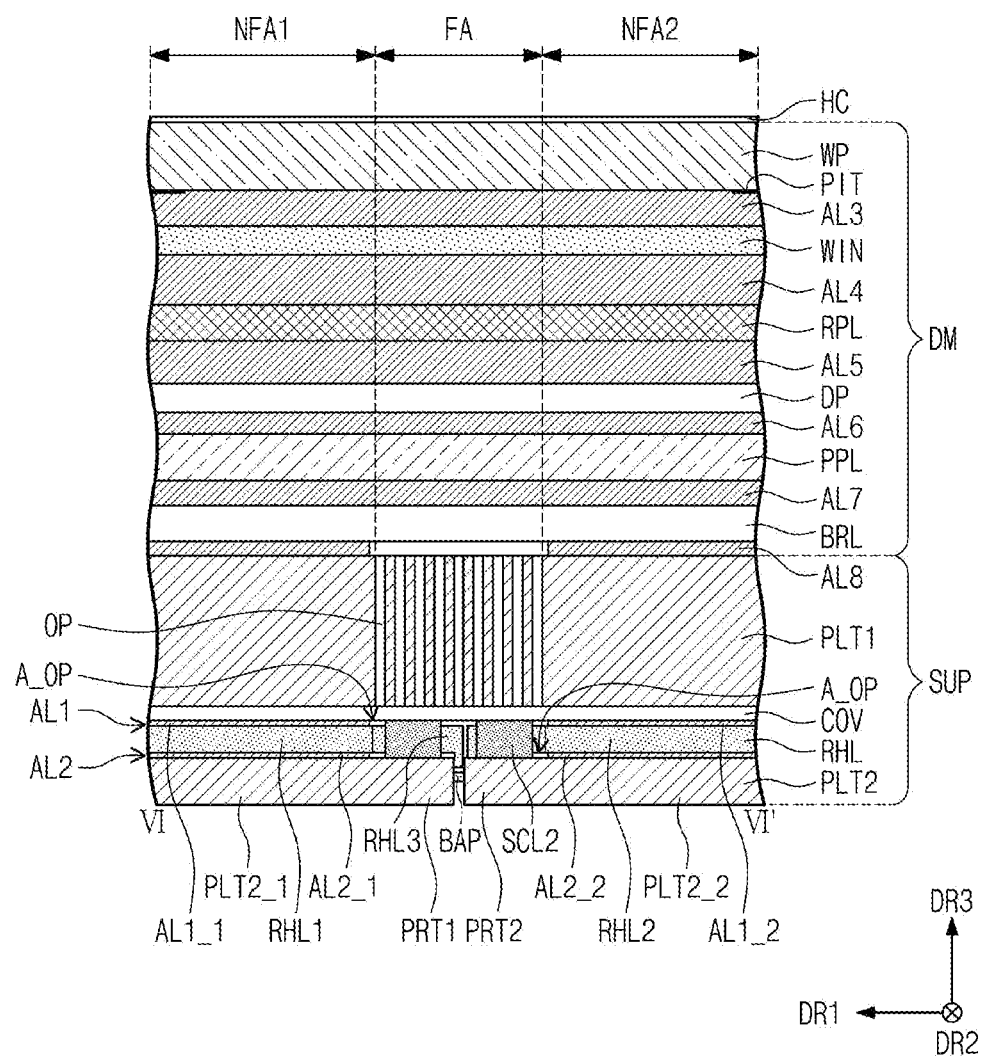
FIG. 14 is a cross-sectional view of a display device taken along a line VI-VI' of FIG. 10 according to an embodiment of the present disclosure.

FIG. 14 is a cross-sectional view taken along a line VI-VI' shown in FIG. 10.

Referring to FIGS. 10, 12, and 14, the second step difference compensation layers SCL2 may overlap the folding area FA and may be disposed between the cover layer COV and the second support plate PLT2. The second step difference compensation layers SCL2 may be disposed between the first heat dissipation portion RHL1 and the second heat dissipation portion RHL2, between the first_first adhesive layer AL1_1 and the first_second adhesive layer AL1_2 (e.g., the open portion A_OP), and between the second_first adhesive layer AL2_1 and the second_second adhesive layer AL2_2 (e.g., the open portion A_OP).

The second step difference compensation layers SCL2 may be disposed in the area between the first heat dissipation portion RHL1 and the second heat dissipation portion RHL2 in positions in which the third heat dissipation portion RHL3 and the first and second adhesive layers AL1 and AL2 are not disposed. Each of the second step difference compensation layers SCL2 may have a thickness greater than a thickness of each of the first step difference compensation layers SCL1 in the third direction DR3. The second step difference compensation layers SCL2 may compensate for a step difference in the area in which the third heat dissipation portion RHL3 and the first and second adhesive layers AL1 and AL2 are not disposed. The first and second protruding portions PRT1 and PRT2 may support the second step difference compensation layers SCL2.

Figure 15:
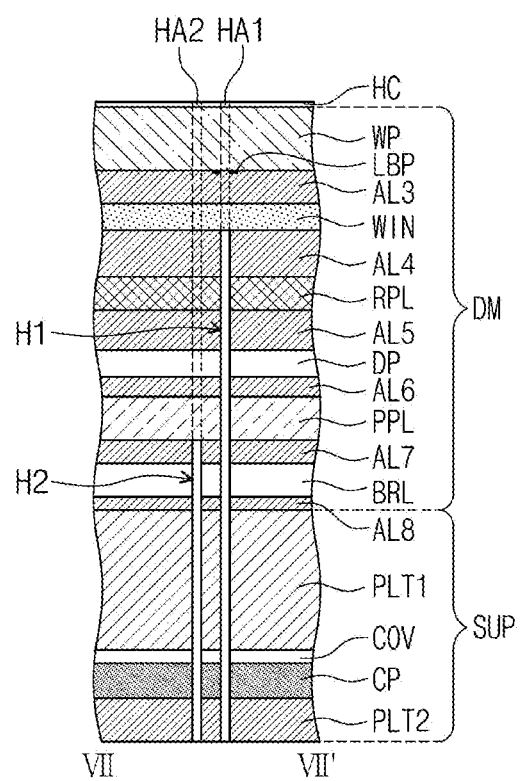
FIG. 15 is a cross-sectional view of a display device taken along a line VII-VII' of FIG. 10 according to an embodiment of the present disclosure.

FIG. 15 is a cross-sectional view taken along a line VII-VII' shown in FIG. 10.

Referring to FIGS. 10 and 15, the first hole H1 and the second hole H2 may be defined through the supporter SUP and the display module DM to overlap the first and second hole areas HA1 and HA2. A light blocking pattern LBP may be disposed around the first hole area HA1. The light blocking pattern LBP may be disposed on the same layer as the print layer PIT. For example, the light blocking pattern LBP may be disposed on the lower surface of the window protective layer WP.

The first hole H1 may be defined through from the second support plate PLT2 and may extend to the fourth adhesive layer AL4. As an example, the first hole H1 may be defined through the second support plate PLT2, the step difference compensation layer CP, the cover layer COV, the first support plate PLT1, the barrier layer BRL, the panel protective layer PPL, the display panel DP, the anti-reflective layer RPL, and the fourth to eighth adhesive layers AL4 to AL8.

The second hole H2 may be defined through from the second support plate PLT2 and may extend to the seventh adhesive layer AL7. As an example, the second hole H2 may be defined through the second support plate PLT2, the step difference compensation layer CP, the cover layer COV, the first support plate PLT1, the barrier layer BRL, and the seventh and eighth adhesive layers AL7 and AL8. In an embodiment, the camera CM may be disposed in the first hole H1, and the sensor SN may be disposed in the second hole H2.

Figure 16:
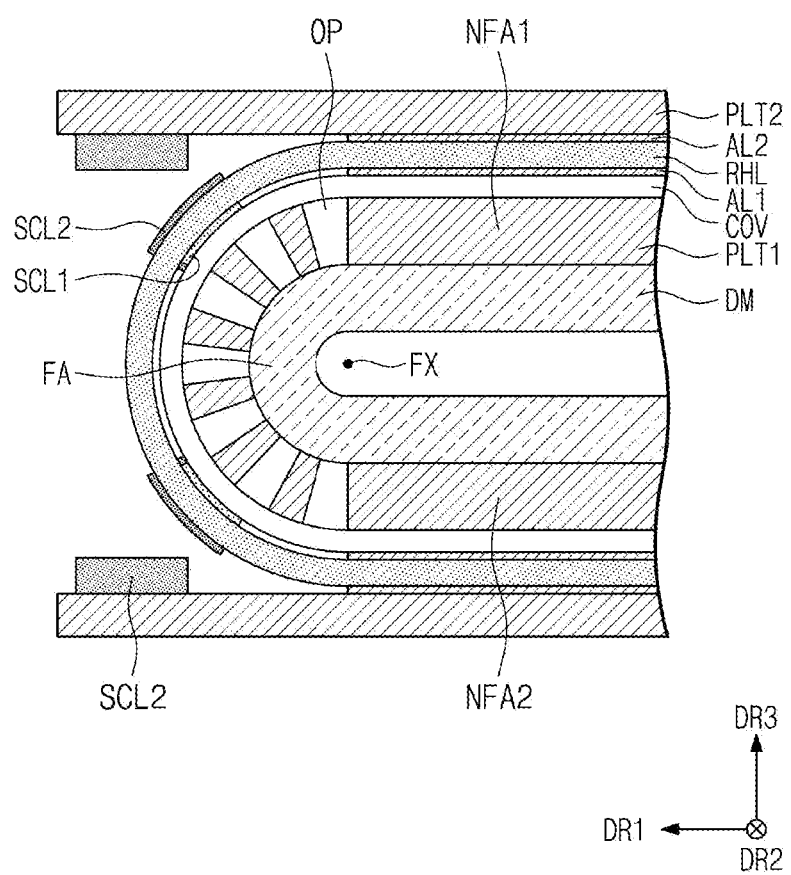
FIG. 16 is a cross-sectional view of an inner-folding state of a display device of FIG. 11 according to an embodiment of the present disclosure.

FIG. 16 is a view of an inner-folding state of the display device DD of FIG. 11.

As an example, the display module DM shown in FIG. 16 may have a single-layer structure.

Referring to FIG. 16, the display device DD may be inwardly folded with respect to a folding axis FX. When the display device DD is folded, the first non-folding area NFA1 and the second non-folding area NFA2 may face each other. A state of the display device DD may be changed from a first state in which the display device DD is unfolded as shown in FIG. 11 to a second state in which the display device DD is folded as shown in FIG. 16 or may be changed from the second state to the first state. This folding operation may be repeatedly performed.

Since the display module DM is a flexible display module, the folding area FA of the display module DM may be easily folded. When the display module DM is folded, the portion of the first support plate PLT1, which overlaps the folding area FA, may be easily bent due to the openings OP of the first support plate PLT1.

Referring to FIGS. 11 and 16, the bending portion BAP of the heat dissipation layer RHL may be bent in a curved shape with a predetermined curvature when the display module DM and the supporter SUP are folded. In a comparative embodiment in which the bending portion BAP is not formed in the heat dissipation layer RHL, a large tensile force may be generated in the portion of the heat dissipation layer RHL overlapping the folding area FA when the folding area FA is folded, and thus, the heat dissipation layer RHL may be damaged.

However, according to an embodiment of the present disclosure, when the display module DM and the supporter SUP are in the unfolded state, the bending portion BAP of the heat dissipation layer RHL may be in the bent shape, and when the display module DM and the supporter SUP are folded, the bent bending portion BAP may be unfolded in the curved shape. Accordingly, the tensile force generated in the portion of the heat dissipation layer RHL overlapping the folding area FA when the folding area FA is folded may be reduced, and thus, the heat dissipation layer RHL may be prevented from being damaged.

Figure 17:
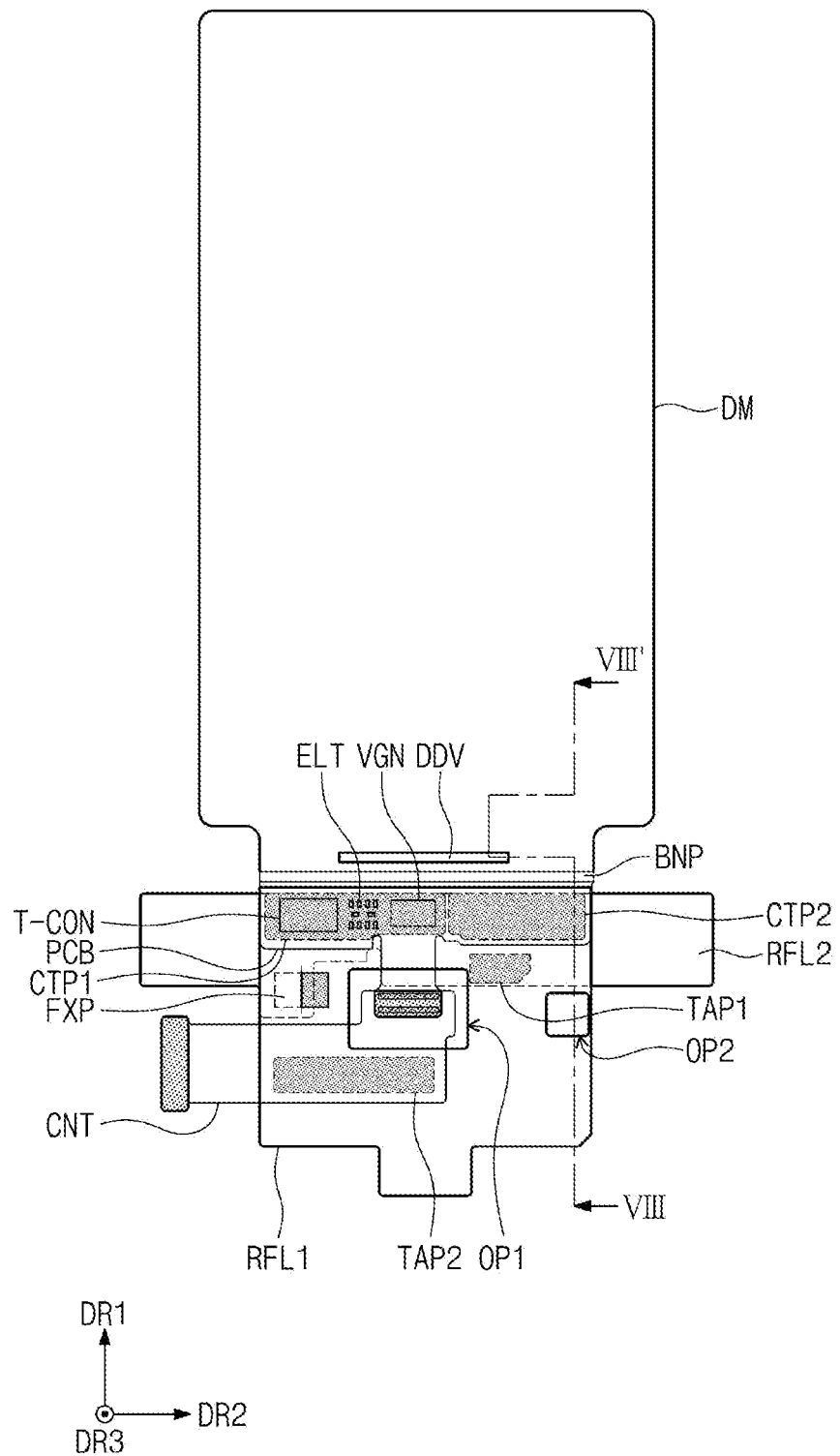
FIG. 17 is a plan view of a printed circuit board connected to a front surface of a display module and first and second release films covering the printed circuit board according to an embodiment of the present disclosure.
Figure 18:
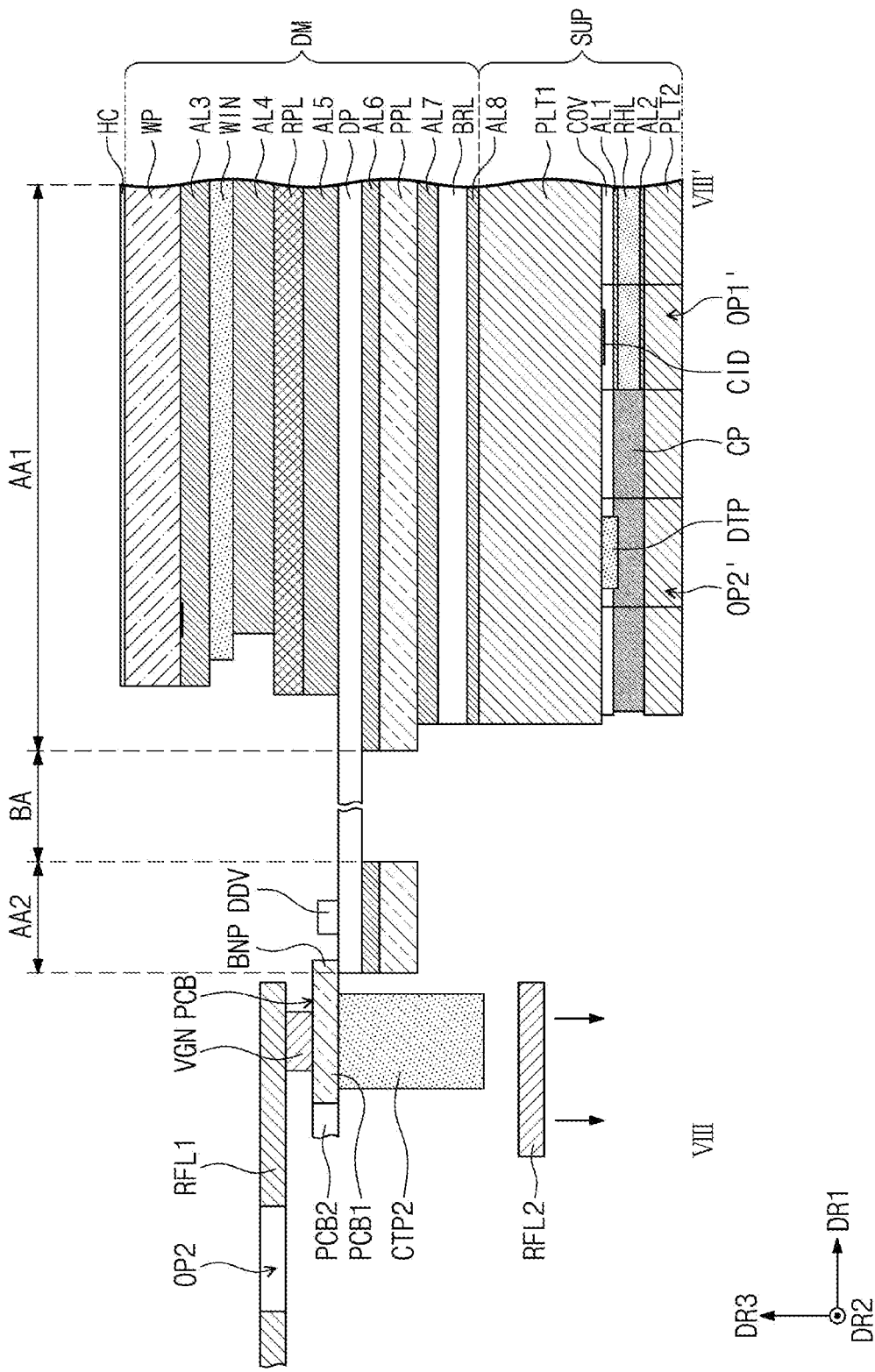
FIG. 18 is a cross-sectional view of a printed circuit board taken along a line VIII-VIII' of FIG. 17 according to an embodiment of the present disclosure.

FIG. 17 is a plan view of the printed circuit board PCB connected to a front surface of the display module DM and the first and second release films RFL1 and RFL2 covering the printed circuit board PCB, and FIG. 18 is a cross-sectional view taken along a line VIII-VIII' of FIG. 17.

FIG. 18 shows a cross-section of the portions of the first and second release films RFL1 and RFL2, the portions of the printed circuit board PCB, the second conductive tape CTP2, and the voltage generator VGN.

Referring to FIGS. 17 and 18, the panel protective layer PPL and the sixth adhesive layer AL6 may not be disposed under the bending area BA. The data driver DDV may be disposed in the second area AA2 of the display panel DP.

The printed circuit board PCB may be connected to the display module DM. The bonding portion BNP may be connected to one side of the second area AA2. The second conductive tape CTP2 may be disposed under the printed circuit board PCB. The second release film RFL2 may be removed from the printed circuit board PCB. The second release film RFL2 may be removed from the second conductive tape CTP2.

In an embodiment, a cell ID layer CID may be disposed on the lower surface of the first support plate PLT1. The cell ID layer CID may be defined as a product's unique identification number. The first opening OP1' may be defined through each of the second support plate PLT2, the heat dissipation layer RHL, the cover layer COV, the first adhesive layer AL1, and the second adhesive layer AL2. The cell ID layer CID may be exposed to the outside through the first opening OP1'.

Figure 19:
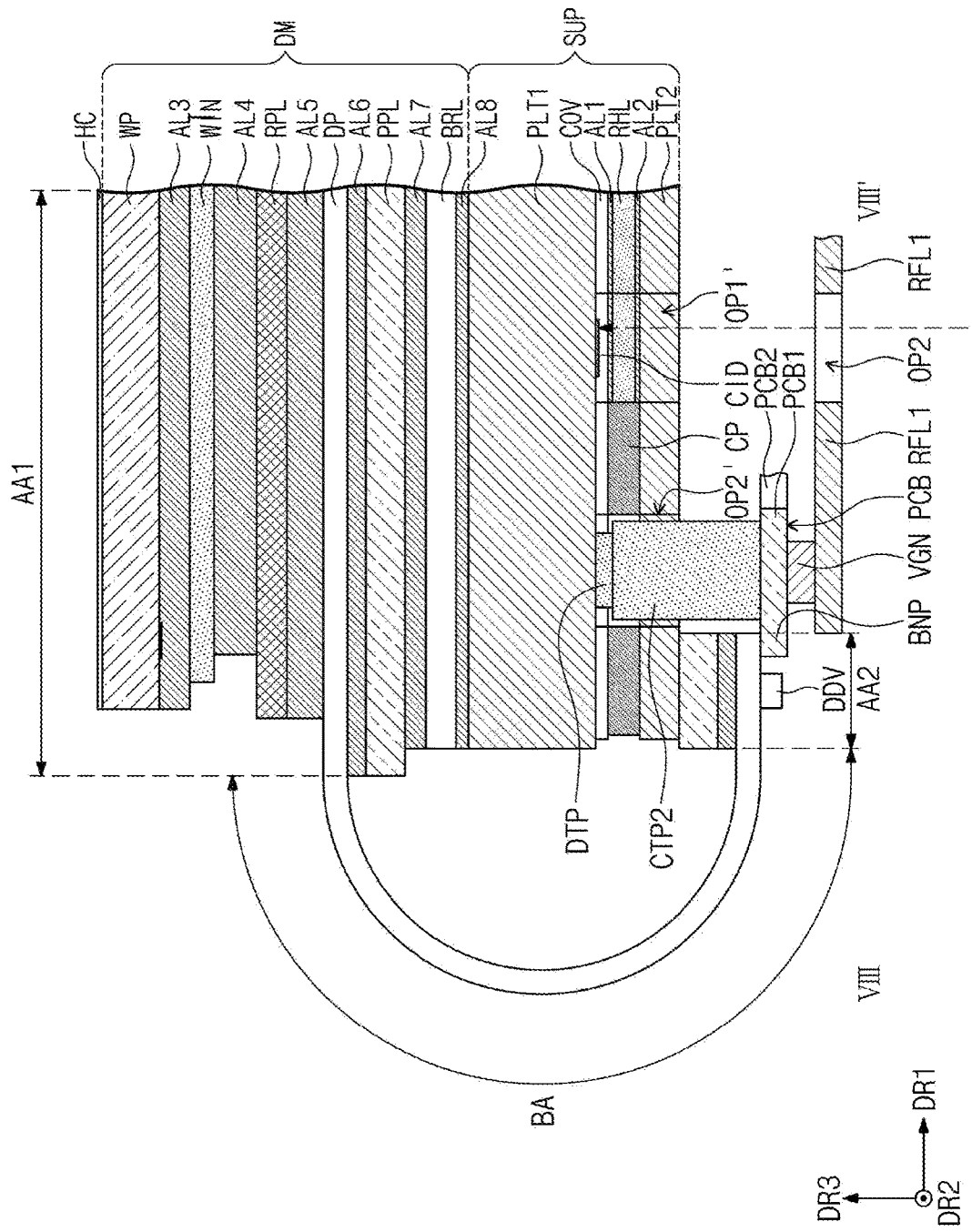
FIG. 19 is a cross-sectional view of a printed circuit board of FIG. 18 having a bending area with a bent state according to an embodiment of the present disclosure.
Figure 20:
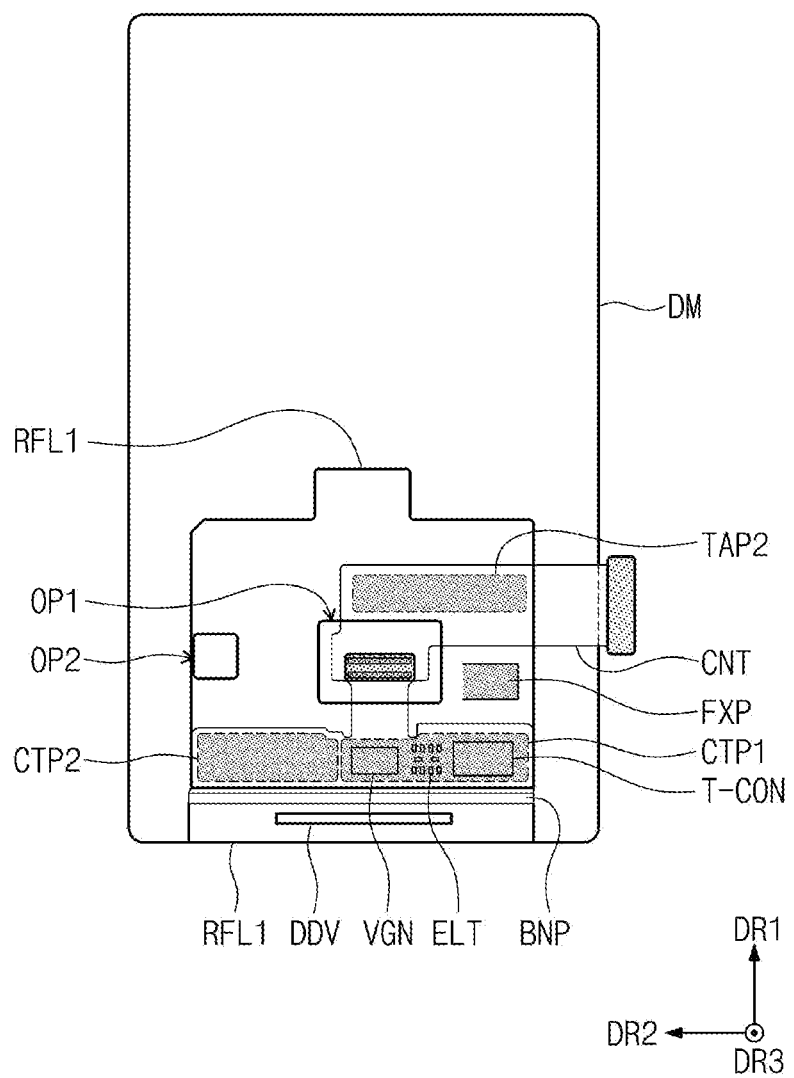
FIG. 20 is a plan view of a printed circuit board connected to a rear surface of a display module and a first release film disposed on the printed circuit board according to an embodiment of the present disclosure.

FIG. 19 is a view of a bent state of the bending area BA of FIG. 18. FIG. 20 is a plan view of the printed circuit board PCB connected to the rear surface of the display module DM and the first release film RFL1 disposed on the printed circuit board PCB.

Referring to FIGS. 19 and 20, the bending area BA may be bent, and thus, the second area AA2 may be disposed under the first area AA1. Accordingly, the data driver DDV, the printed circuit board PCB, the voltage generator VGN, the second conductive tape CTP2, and the first release film RFL1 may be disposed under the first area AA1.

In an embodiment, the timing controller T-CON and the first conductive tape CTP1 may be disposed under the first area AA1. Referring to FIG. 19, the first release film RFL1 may be disposed under the printed circuit board PCB and the connector CNT.

The data driver DDV, the printed circuit board PCB, the voltage generator VGN, the timing controller T-CON, and the first and second conductive tapes CTP1 and CTP2 may be disposed under the second support plate PLT2.

The second opening OP2' may be defined through the second support plate PLT2, the step difference compensation layer CP, and the cover layer COV. The second conductive tape CTP2 may be inserted into the second opening OP2' and may be attached to the first support plate PLT1. The second conductive tape CTP2 may be attached to the first support plate PLT1, and the printed circuit board PCB may be fixed to the supporter SUP. For example, the second conductive tape CTP2 may be pressed to the first support plate PLT1 and may be attached to the first support plate PLT1.

In an embodiment, the first conductive tape CTP1 may be disposed in the second opening OP2'. However, the first conductive tape CTP1 may not be attached to the first support plate PLT1.

Referring to FIG. 6A, the timing controller T-CON, the voltage generator VGN, and the elements ELT may be disposed on the first conductive tape CTP1. In a comparative embodiment in which the first conductive tape CTP1 is the double-sided tape and the first conductive tape CTP1 is pressed to the first support plate PLT1 to attach the first conductive tape CTP1 to the first support plate PLT1, the timing controller T-CON, the voltage generator VGN, and the elements ELT may be damaged by the pressure. Accordingly, in an embodiment the first conductive tape CTP1 may be formed as the single-sided tape and may be disposed only in the second opening OP2' without being attached to the first support plate PLT1.

The second conductive tape CTP2 on which the timing controller T-CON, the voltage generator VGN, and the elements ELT are not disposed as shown in FIG. 6A may be pressed to the first support plate PLT1 and may be attached to the first support plate PLT1 in FIG. 19.

A dummy tape DTP may be disposed between the first support plate PLT1 and the second conductive tape CTP2. The second conductive tape CTP2 may be attached to the first support plate PLT1 by the dummy tape DTP.

In an embodiment, the dummy tape DTP may include a single-sided tape. As an example, an adhesive may be disposed on an upper surface of the dummy tape DTP facing the first support plate PLT1, and the adhesive may not be disposed on a lower surface of the dummy tape DTP facing the second conductive tape CTP2. The upper surface of the dummy tape DTP may be attached to the lower surface of the first support plate PLT1, and a surface of the second conductive tape CTP2 facing the dummy tape DTP may be attached to the lower surface of the dummy tape DTP.

In an embodiment, the connector CNT may be connected to an external test device. The test device may apply a test signal to the printed circuit board PCB via the connector CNT. The test signal may be applied to the display module DM via the printed circuit board PCB. Due to the test signal, it may be determined whether the display module DM is operating normally.

The second opening OP2 defined through the first release film RFL1 may overlap the first opening OP1'. After the printed circuit board PCB is attached to the supporter SUP, the display module DM, the supporter SUP, and the printed circuit board PCB may proceed to a subsequent process in a state in which the connector CNT and the first release film RFL1 are not removed. The operator may check the product's unique identification number through the second opening OP2 and the first opening OP1' during the process.

In the subsequent process, the first release film RFL1 and the connector CNT used only for the test may be removed from the printed circuit board PCB. Then, the display module DM, the supporter SUP, and the printed circuit board PCB may be accommodated in a set structure or a housing.

Figure 21:
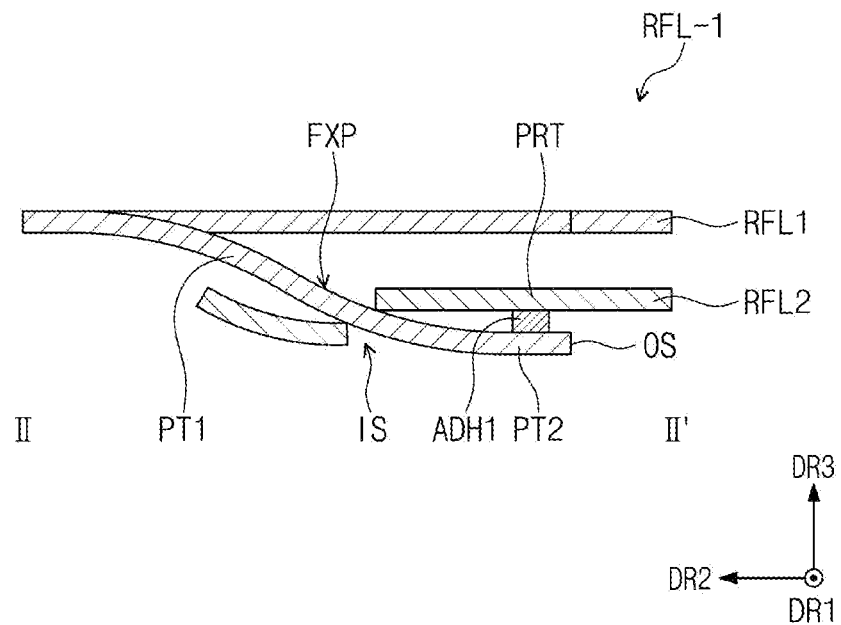
FIGS. 21 to 23 are cross-sectional views of configurations of release films according to embodiments of the present disclosure.
Figure 22:
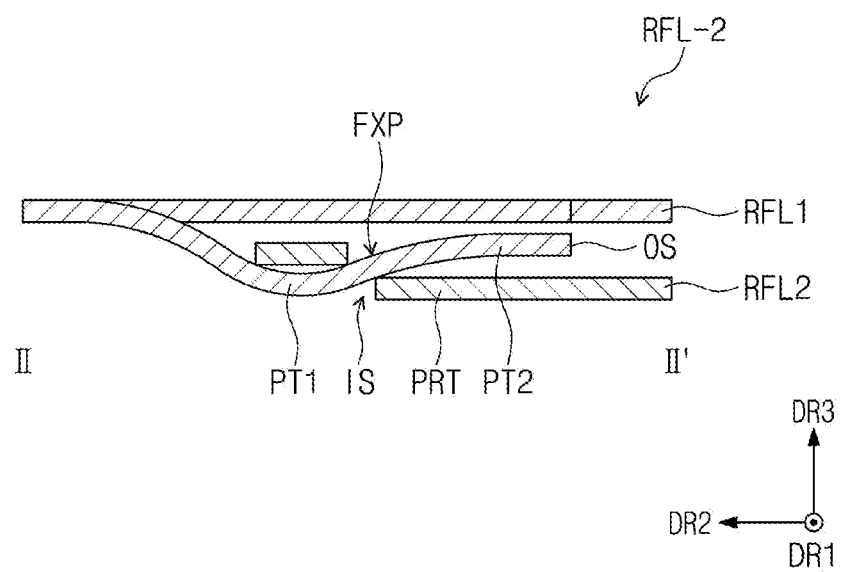
Figure 23:
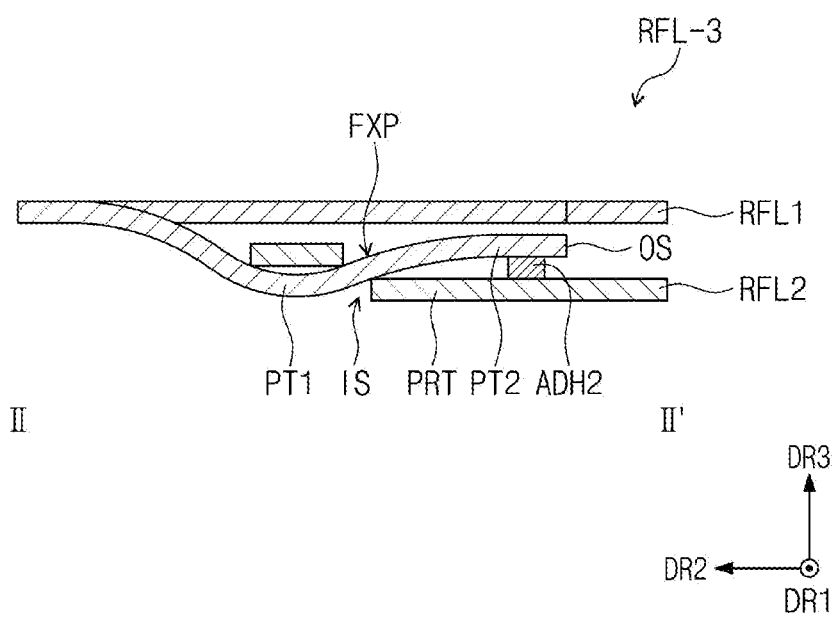

FIGS. 21 to 23 are views of configurations of release films RFL-1, RFL-2, and RFL-3 according to embodiments of the present disclosure.

As an example, FIG. 21 is a cross-sectional view corresponding to that of FIG. 7A. Hereinafter, configuration of the release films RFL-1 to RFL-3 shown in FIGS. 21 to 23, which are different from those of FIG. 7A, will be mainly described.

Referring to FIG. 21, the release film RFL-1 may include first and second release films RFL1 and RFL2 and an adhesive layer ADH1. The first and second release films RFL1 and RFL2 may be coupled to each other in the same manner as shown in FIG. 7A.

The adhesive layer ADH1 may be disposed under the protruding portion PRT. The adhesive layer ADH1 may be disposed between the second portion PT2 and the protruding portion PRT. The first release film RFL1 may be more securely fixed to the second release film RFL2 by the adhesive layer ADH1.

When the second release film RFL2 is removed from the first release film RFL1, the adhesive layer ADH1 may be removed with the second release film RLF2. As an example, an adhesion force of the adhesive layer ADH1 to the first release film RFL1 may be less than an adhesion force of the adhesive layer ADH1 to the second release film RFL2.

Referring to FIG. 22, the release film RFL-2 may include a first release film RFL1 and a second release film RFL2. A fixing portion FXP of the first release film RFL1 may be inserted into an incision portion IS and may be disposed on the second release film RFL2.

One side OS of the fixing portion FXP may pass through the incision portion IS extend under the second release film RFL2 and may be disposed on the second release film RFL2. For example, the fixing portion FXP may extend under the protruding portion PRT from the outside of the protruding portion PRT and may be disposed under the protruding portion PRT, and then the fixing portion FXP may be inserted into the incision portion and may extend on the protruding portion PRT (e.g., is disposed on an upper surface of the protruding portion PRT). Accordingly, the first portion PT1 may be disposed under the protruding portion PRT, and the one side OS of the fixing portion FXP and the second portion PT2 may be positioned above the protruding portion PRT and may be disposed on an upper surface of the protruding portion PRT.

Referring to FIG. 23, the release film RFL-3 may include first and second release films RFL1 and RFL2 and an adhesive layer ADH2. The first and second release films RFL1 and RFL2 may be coupled to each other in the same manner as an embodiment shown in FIG. 22.

The adhesive layer ADH2 may be disposed on a protruding portion PRT. The adhesive layer ADH2 may be disposed between a second portion PT2 and the protruding portion PRT. The first release film RFL1 may be more securely fixed to the second release film RFL2 by the adhesive layer ADH2.

When the second release film RFL2 is removed from the first release film RFL1, the adhesive layer ADH2 may be removed together with the second release film RLF2. For example, an adhesion force of the adhesive layer ADH2 to the first release film RFL1 may be less than an adhesion force of the adhesive layer ADH2 to the second release film RFL2.

Although embodiments of the present disclosure have been described, it is understood that the present disclosure should not be limited to these embodiments but various changes and modifications can be made by one ordinary skilled in the art within the spirit and scope of the present disclosure as hereinafter claimed.

What is claimed is:

1. A release film comprising:
   a first release film disposed on a printed circuit board and a connector that is connected to the printed circuit board, wherein the first release film comprises a fixing portion having a shape extending in one direction; and
   a second release film disposed under the printed circuit board, the second release film including an incision portion,
   wherein the fixing portion extends into the incision portion.

2. The release film of claim 1, wherein the fixing portion includes:
   a first incision portion extending through the first release film in a first direction, the first incision portion defining a first side of the fixing portion; and
   second incision portions extending through the first release film in a second direction crossing the first direction from both ends of the first incision portion.

3. The release film of claim 2, wherein the incision portion of the second release film extends in the first direction.

4. The release film of claim 2, wherein:
   the second release film is separated from the first release film from a first side of the second release film to an opposite second side of the second release film along the second direction; and
   the first side of the fixing portion faces the second side of the second release film.

5. The release film of claim 2, wherein the first side of the fixing portion passes through the incision portion from above the second release film and is disposed under the second release film.

6. The release film of claim 2, wherein the fixing portion extends through the incision portion, extends under the second release film and the first side of the fixing portion is disposed on an upper surface of the second release film.

7. The release film of claim 2, wherein the second release film comprises a protruding portion that is protruded in the first direction and does not overlap the printed circuit board and the connector, wherein the protruding portion includes the incision portion.

8. The release film of claim 7, wherein the fixing portion overlaps a portion of the protruding portion from an outer portion of the protruding portion when viewed in a plane, and the first side of the fixing portion overlaps the protruding portion.

9. The release film of claim 8, wherein the fixing portion comprises:
   a first portion disposed from the outer portion of the protruding portion to the incision portion when viewed in the plane; and
   a second portion disposed from the incision portion to the first side of the fixing portion when viewed in the plane.

10. The release film of claim 9, wherein the first portion is disposed above the protruding portion, and the second portion is disposed under the protruding portion.

11. The release film of claim 9, further comprising an adhesive layer disposed between the second portion and the protruding portion.

12. The release film of claim 9, wherein the first portion is disposed under the protruding portion, and the second portion is disposed above the protruding portion.

13. The release film of claim 1, wherein the printed circuit board comprises:
- a first substrate portion extending in a second direction on a plane defined by the second direction and a first direction crossing the second direction;
- a second substrate portion extending in the first direction from a portion of the first substrate portion; and
- a contact portion connected to a first side of the second substrate portion facing the first direction, and the second release film is disposed under the first and second substrate portions and does not overlap the contact portion when viewed in a plane.

14. The release film of claim 13, wherein the connector comprises:
- a flexible circuit film;
- a first contact portion connected to a first side of the flexible circuit film and connected to the contact portion; and
- a second contact portion connected to an opposite second side of the flexible circuit film, wherein the contact portion and the first contact portion are exposed through a first opening defined through the first release film.

15. The release film of claim 14, wherein:
- a first conductive tape and a second conductive tape are disposed under the first substrate portion and are arranged in the second direction:
- the second release film is disposed under the first substrate portion and covers the first and second conductive tapes;
- the fixing portion is disposed adjacent to the first conductive tape in the first direction, the first conductive tape is attached to the first substrate portion and is not attached to the second release film, and the second conductive tape is attached to the first substrate portion and the second release film.

16. The release film of claim 15, further comprising:
- a first tape adjacent to the second conductive tape in the first direction and disposed between the first release film and the second release film; and
- a second tape disposed between the flexible circuit film and the first release film.

17. The release film of claim 15, wherein parts are disposed on the first substrate portion overlapping the first conductive tape, and the first release film is disposed on the parts.

18. The release film of claim 15, wherein:
- the first release film includes a second opening defined therethrough, the second opening does not overlap the second release film;
- a cell ID layer is disposed on a lower surface of a first support plate that is disposed under a display module, wherein the cell ID layer is exposed through the second opening when the second release film is removed; and
- the printed circuit board is disposed under the first support plate.

19. A release film comprising:
- a first release film disposed on a printed circuit board and a connector that is connected to the printed circuit board, wherein the first release film comprises a fixing portion having a shape extending in one direction; and
- a second release film disposed under the printed circuit board, the second release film including an incision portion,
- wherein the fixing portion extends into the incision portion and a portion of the fixing portion that is adjacent to a first side of the fixing portion is disposed under the second release film.

20. A release film comprising:
- a first release film disposed on a printed circuit board and a connector that is connected to the printed circuit board, wherein the first release film includes a fixing portion having a first incision portion extending through the first release film in a first direction and defining a first side of the fixing portion and second incision portions extending through the first release film in a second direction crossing the first direction from both ends of the first incision portion; and
- a second release film disposed under the printed circuit board, the second release film including an incision portion,
- wherein the first side of the fixing portion extends into the incision portion and a portion of the fixing portion is disposed under the second release film.

* * * * *